United States Patent
Liu

(10) Patent No.: US 7,611,943 B2
(45) Date of Patent: Nov. 3, 2009

(54) TRANSISTORS, INTEGRATED CIRCUITS, SYSTEMS, AND PROCESSES OF MANUFACTURE WITH IMPROVED WORK FUNCTION MODULATION

(75) Inventor: Kaiping Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/248,079

(22) Filed: Oct. 12, 2005

(65) Prior Publication Data

US 2006/0084247 A1   Apr. 20, 2006

Related U.S. Application Data

(60) Provisional application No. 60/620,863, filed on Oct. 20, 2004.

(51) Int. Cl.
    *H01L 21/336* (2006.01)
(52) U.S. Cl. .................. 438/232; 438/183; 438/199; 438/229; 438/655; 438/656; 438/657; 257/E21.051; 257/E21.203; 257/E21.204
(58) Field of Classification Search ............. 438/652, 438/510, 199, 229, 183, 655, 656, 657; 257/E21.051, 257/E21.203, E21.204
    See application file for complete search history.

(56) References Cited

U.S. PATENT DOCUMENTS

| 4,107,835 A | 8/1978 | Bindell et al. |
|---|---|---|
| 4,672,419 A | 6/1987 | McDavid |
| 4,931,411 A | 6/1990 | Tigelaar et al. |
| 5,395,773 A * | 3/1995 | Ravindhran et al. ......... 438/217 |
| 5,937,315 A | 8/1999 | Xiang et al. |
| 6,051,460 A | 4/2000 | Nayak et al. |
| 6,060,741 A | 5/2000 | Huang |
| 6,083,836 A | 7/2000 | Rodder |
| 6,130,123 A | 10/2000 | Liang et al. |
| 6,136,655 A | 10/2000 | Assaderaghi et al. |
| 6,225,168 B1 | 5/2001 | Gardner et al. |
| 6,265,258 B1 | 7/2001 | Liang et al. |
| 6,373,111 B1 | 4/2002 | Zheng et al. |
| 6,376,888 B1 | 4/2002 | Tsunashima et al. |
| 6,383,879 B1 | 5/2002 | Kizilyalli et al. |
| 6,410,967 B1 | 6/2002 | Hause et al. |
| 6,432,817 B1 | 8/2002 | Bertrand et al. |
| 6,492,217 B1 | 12/2002 | Bai et al. |
| 6,511,876 B2 | 1/2003 | Buchanan et al. |
| 6,525,391 B1 | 2/2003 | Bertrand et al. |
| 6,541,866 B1 | 4/2003 | Bertrand et al. |

(Continued)

OTHER PUBLICATIONS

Maszara, Transistors with dual work function metal gates by single full silicidation of polysilicon, IEDM, pp. 367-369, 2002.*

(Continued)

*Primary Examiner*—Kiesha L Rose
*Assistant Examiner*—Minchul Yang
(74) *Attorney, Agent, or Firm*—Wade J. Brady, III; Frederick J. Telecky, Jr.

(57) ABSTRACT

A process (200) for making integrated circuits with a gate, uses a doped precursor (124, 126N and/or 126P) on barrier material (118) on gate dielectric (116). The process (200) involves totally consuming (271) the doped precursor (124, 126N and/or 126P) thereby driving dopants (126N and/or 126P) from the doped precursor (124) into the barrier material (118). An integrated circuit has a gate dielectric (116), a doped metallic barrier material (118, 126N and/or 126P) on the gate dielectric (116), and metal silicide (180) on the metallic barrier material (118). Other integrated circuits, transistors, systems and processes of manufacture are disclosed.

17 Claims, 13 Drawing Sheets

U.S. PATENT DOCUMENTS

| | | |
|---|---|---|
| 6,573,571 B2 | 6/2003 | Li |
| 6,602,781 B1 | 8/2003 | Xiang et al. |
| 6,617,624 B2 | 9/2003 | Powell |
| 6,642,090 B1 | 11/2003 | Fried et al. |
| 6,660,605 B1 | 12/2003 | Liu |
| 6,677,208 B2 | 1/2004 | Mehrotra et al. |
| 6,686,637 B1 | 2/2004 | Dokumaci et al. |
| 6,689,673 B1 | 2/2004 | Hsu et al. |
| 6,693,333 B1 | 2/2004 | Yu |
| 6,696,333 B1 | 2/2004 | Zheng et al. |
| 6,696,345 B2 | 2/2004 | Chau et al. |
| 6,713,360 B2 | 3/2004 | Jain et al. |
| 6,849,509 B2 | 2/2005 | Barnak et al. |
| 6,914,295 B2 | 7/2005 | Chau et al. |
| 6,936,508 B2 | 8/2005 | Visokay et al. |
| 7,022,559 B2 | 4/2006 | Barnak et al. |
| 7,030,430 B2 | 4/2006 | Doczy et al. |
| 7,126,199 B2 | 10/2006 | Doczy et al. |
| 7,148,143 B2 | 12/2006 | Bu et al. |
| 7,187,044 B2 | 3/2007 | Liang et al. |
| 7,321,154 B2 | 1/2008 | Colombo et al. |
| 7,329,913 B2 | 2/2008 | Brask et al. |
| 7,332,439 B2 | 2/2008 | Lindert et al. |
| 2003/0045080 A1 | 3/2003 | Visokay et al. |
| 2003/0104663 A1 | 6/2003 | Visokay et al. |
| 2003/0109121 A1 | 6/2003 | Rotondaro |
| 2003/0146480 A1 | 8/2003 | Abiko |
| 2003/0164525 A1 | 9/2003 | Rotondaro et al. |
| 2003/0235973 A1 | 12/2003 | Lu et al. |
| 2004/0007747 A1 | 1/2004 | Visokay et al. |
| 2004/0033669 A1 | 2/2004 | Rotondaro et al. |
| 2004/0048424 A1 | 3/2004 | Wu et al. |
| 2004/0061178 A1 | 4/2004 | Lin et al. |
| 2004/0061184 A1 | 4/2004 | Lu et al. |
| 2005/0054149 A1 | 3/2005 | Xiang et al. |
| 2005/0055494 A1 | 3/2005 | Doris et al. |
| 2005/0056881 A1* | 3/2005 | Yeo et al. .................. 257/315 |
| 2005/0064636 A1* | 3/2005 | Cabral et al. .............. 438/184 |
| 2005/0070062 A1 | 3/2005 | Visokay et al. |
| 2005/0074932 A1 | 4/2005 | Lin et al. |
| 2005/0079695 A1 | 4/2005 | Carriere et al. |
| 2005/0106788 A1 | 5/2005 | Amos et al. |
| 2005/0136605 A1 | 6/2005 | Murto et al. |
| 2005/0158974 A1 | 7/2005 | Chau et al. |
| 2005/0186747 A1 | 8/2005 | Amos et al. |
| 2005/0189599 A1 | 9/2005 | Lu et al. |
| 2005/0205942 A1 | 9/2005 | Lin et al. |
| 2005/0215037 A1 | 9/2005 | Lu et al. |
| 2005/0215055 A1 | 9/2005 | Bu et al. |
| 2006/0134844 A1 | 6/2006 | Lu et al. |

OTHER PUBLICATIONS

Kim, Tungsten silicide/titanium nitride compound gate for submicron CMOSFET, IEEE, pp. 115-116, 1990.*

Maszara, Fully silicided metal gates for high performance CMOS technology, J. Electrochemical Society, 152, pp. 550-555, 2005.*

Kakumu, et al., "Work Function Controlled Silicide Technology for Submicron CMOS," Semiconductor Device Engineering Laboratory Toshiba Corporation, Paper II-5, pp. 30-31, Fig. 2, Table 1, Kawasaki Japan.

Kakumu, et al., "Lightly Impurity Doped (LD) Mo Silicide Gate Technology," 1985 IEEE, IEDM, pp. 415-418, Figs. 1, 7.

Kim, et al., "Tungsten Silicide/Titanium Nitride Compound Gate for Submicron CMOSFET," 1990 IEEE, Symposium on VLSI Techology, Paper 9-4, pp. 115-116, Fig. 1.

Lu, et al., "A Novel Nickel Salicide Process Technology for CMOS Devices with sub-40nm Physical Gate Length," 2002 IEEE, IEDM, pp. 371-374, Figs. 3,4,8,9.

Maszara, et al., "Transistors with Dual Work Function Metal Gates by Single Full Silicidation (FUSI) of Polysilicon Gates," 2002 IEEE, IEDM, pp. 367-370, Figs. 1, 8, 9.

Baron, et al., "Five Chips from TI—Or, Is It Six?" Instat-MDR Microprocessor Report, Mar. 17, 2003, pp. 1-6, Figs. 1, 3, 4.

Kedzierski, et al., "Threshold Voltage Control In NiSi-gated MOSFETs Through Silicidation Induced Impurity Segregation (SIIS)," 2003 IEEE, IEDM 03-315, pp. 13.3.1-13.3.4, Figs. 1, 18.

Aime, et al., "Work Function Tuning Through Dopant Scanning and Related Effects in Ni Fully Silicided Gate For sub-45nm Nodes CMOS," Jan. 2004 IEEE, 4 pages, Figs. 1, 2, 3a, 3b, 4.

Jeon, et al., "A Novel Methodology on Tuning Work Function of Metal Gate Using Stacking Bi-Metal Layers," Jan. 2004 IEEE, 4 pages, Figs. 1, 4, 6.

Takahashi, et al., "Dual Workfunction Ni-Silicide/HfSiON Gate Stacks by Phase-Controlled Full-Silicidation (PC-FUSI) Technique for 45nm-node LSTP and LOP Devices," Jan. 2004 IEEE, 4 pages, Fig. 1.

* cited by examiner

TRANSISTORS, INTEGRATED CIRCUITS, SYSTEMS, AND PROCESSES OF MANUFACTURE WITH IMPROVED WORK FUNCTION MODULATION

CROSS-REFERENCE TO RELATED APPLICATIONS

This application is related to provisional U.S. patent application Ser. No. 60/620,863, (TI-37388P) filed Oct. 20, 2004, titled "Transistors, Integrated Circuits, Systems, And Processes Of Manufacture With Improved Work Function Modulation," for which priority under 35 U.S.C. 119(e)(1) is hereby claimed and which is hereby incorporated herein by reference.

STATEMENT REGARDING FEDERALLY SPONSORED RESEARCH OR DEVELOPMENT

Not applicable.

FIELD OF THE INVENTION

The invention pertains to the fields of transistors, integrated circuits, systems, and processes of their manufacture.

BACKGROUND OF THE INVENTION

To mention just one application area, wireless mobile product technology continues to demand more applications performance, less power drain on batteries, and lower integrated circuit cost of manufacture. These demands translate into metrics such as milliwatts of power dissipation per gigahertz (mW/GHz), trillions of operations (GigaOPS or GOPS) per second or per square centimeter (GOPS/cm2), battery life (days), and so on. Improvements in processes of manufacture and improvements in integrated circuit structure can make improved wireless mobile products possible. Continuing trends in semiconductor product manufacturing include reduction in electrical device feature sizes (scaling). However, currently, the prospect of smaller processes below 0.09 micron (90 nanometers) gate width suggests problems such as 1) increased leakage current that impedes the goal of reduced power dissipation and 2) increased resistances in signal paths that introduce undesirable signal delay that impedes the goal of higher speed and GOPS.

Field effect transistors (FETs) are widely used in the electronics industry for switching, amplification, filtering, and other tasks related to both analog and digital electrical signals. In metal-oxide-semiconductor field-effect transistors (MOSFETs), a gate electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode is formed over the gate dielectric. Together, the gate dielectric and gate electrode form what is called the gate stack, which is patterned and etched to form the gate structure overlying the channel region of the substrate.

In the MOS transistor, the gate requires a threshold voltage (Vt) to render the channel conductive. Complementary MOS (CMOS) processes fabricate both n-channel and p-channel (NMOS and PMOS) transistors to make logic and other circuitry. For enhancement-mode (normally off) devices, the threshold voltage Vt is positive for NMOS and the threshold voltage is negative for PMOS transistors. The threshold voltage is influenced by what is called the work function difference.

The work function of one material is the difference between the reference level of the vacuum and an energy level called the Fermi level or thermodynamic equilibrium level attributed by solid state physics to the material. When the material is a semiconductor, allowed energies of carriers remarkably are divided into ranges, a lower one called the valence band and a higher one called the conduction band separated by a bandgap of unused range of energies between those two bands. Undoped semiconductor material, called intrinsic semiconductor, has a Fermi level in the middle of the bandgap.

Generally speaking, the work function is a measure of the energy, in electron volts (eV), required to eject an electron in the material outside of a material atom to the vacuum, if the electron were initially at the Fermi level. The work function difference between the gate and the channel is essentially an arithmetic difference between the work function of the gate material closest to the channel region and the work function of the material of the channel region. N-doping moves the Fermi level higher toward the conduction band edge and reduces the work function relative to the work function of intrinsic semiconductor. P-doping moves the Fermi level lower toward the valence band edge and increases the work function relative to the work function of intrinsic semiconductor.

Generally, a desirable process of manufacture makes the threshold voltages (Vt) for the NMOS and PMOS transistors predictable, repeatable, and stable. To establish Vt values, the work function differences of the respective PMOS and NMOS gate materials and their corresponding channel regions are independently established through channel processing and gate processing.

Channel processing can include shallow dopant (impurity) implants to the prospective channel regions of the semiconductor body, sometimes referred to as threshold adjust (Vt adjust) implants. These implanted impurities introduce a sheet of fixed charge located under the gate oxide. A Vt adjust implant for the NMOS devices introduces boron or other p-type impurities into the NMOS channel region to raise the channel work function (sometimes referred to as a VTN implant). A Vt adjust implant for the PMOS devices introduces arsenic, phosphorus, or other n-type impurities to lower the PMOS channel work function (VTP implant). In this manner, the Vt for the channels can be separately adjusted for NMOS and PMOS devices. Channel processing may include multiple implants, for example, a Vt adjust implant, a punch-thru implant to suppress punch-through, and a channel stop implant, for each of the NMOS and PMOS devices.

Gate processing adjusts the work function of the gate materials for PMOS and NMOS independently. Polysilicon has a work function that is readily raised or lowered by doping the polysilicon with p-type or n-type impurities for PMOS and NMOS respectively, typically during implantation of the respective source/drain regions following gate patterning. In this way, the final gate work functions are typically near the Si conduction band edge for NMOS and near the valence band edge for PMOS. (The semiconductor has permitted bands of energy levels for electrons;. The bands are separated by a bandgap of energies in which electrons can not exist. In undoped semiconductor the Fermi level is at the middle of the bandgap, and doping moves the Fermi level closer to, or even into one band or the other.)

Dopants in the polysilicon also increase the electrical conductivity of the gate. Polysilicon has thus far been widely using in the fabrication of CMOS devices, wherein the gate doping provides a desired gate contact conductivity, and the threshold voltage fine tuning is achieved by the Vt adjust implants to the channel to affect the channel work function.

The gate dielectric or gate oxide is $SiO_2$ or other dielectric interposed between the channel and the gate to electrically insulate the gate from the channel while allowing introduction of an electric field into the channel to control conduction between source and drain as a result of applying a voltage to the gate. MOS transistor performance may be improved by reducing the distance between the source and the drain regions under the gate electrode of the device, known as the gate or channel length, and by reducing the thickness of the layer of gate dielectric that is formed over the semiconductor surface. However, there are electrical and physical limitations on the extent to which $SiO_2$ gate dielectrics can be made thinner. These include gate leakage currents tunneling through the thin gate oxide, difficulty of forming very thin oxide with uniform thickness, and dopant diffusion from the gate through thin gate dielectric into the underlying channel. For example, tunneling increases gate leakage and delivers into the channel, carriers of opposite type from the gate than the carriers intended in the channel which increases channel resistance and decreases on-current. Doping diffusion through gate dielectric produces threshold voltage Vt instability, channel mobility degradation and other problems.

One approach to provide equivalent gate capacitance and field effect performance uses high-k gate dielectric material having a dielectric constant greater than that of $SiO_2$ and provided as a layer greater in thickness than a given thickness of the $SiO_2$ by a ratio equal to the ratio of high-k dielectric constant to the dielectric constant of $SiO_2$. ("k" refers to the dielectric constant of the dielectric material.)

Gate polysilicon depletion causes reduction in device performance which leads to poor unscalable devices. This poly depletion occurs when annealing or other thermal back-end processing of the implanted polysilicon is insufficient to drive the implanted impurities down the entire depth of the polysilicon gate structures or limited by dopant activation level in poly. A bottom portion of the polysilicon gate contact near the gate dielectric is "depleted" of charges, and acts as an insulator, increases the effective thickness between the effectively-acting gate and the channel and thereby reduces ability to control current flow in the channel. This is because part of the applied gate voltage is dropped across the gate itself. The electric field delivered to the channel by the gate is reduced at a given gate voltage, and the switching speed of the FET is reduced as a result.

Simply increasing the implant energy and/or anneal time to combat poly depletion has adverse results, in that the corresponding depths of the concurrently implanted source/drain regions are increased. Furthermore, because the implant process drives impurities to a variety of depths according to a statistical depth distribution, physical damage to gate dielectric occurs by impact and recoil. Moreover, alteration and damage not only occur to gate dielectric but also to the channel region by introduction of unintended impurities into both gate dielectric and channel region. As gates and gate dielectrics become thinner through scaling, the poly depletion region thickness becomes of proportionally greater significance relative to the effective gate thickness and relatively to the ever-thinner gate dielectric thickness. Polysilicon gate technology becomes less attractive as scaling efforts continue.

Metal gate technology in CMOS avoids polysilicon depletion issues with respect to gate capacitance, but there remains a need for dual or differentiated work function capability for the PMOS and NMOS transistors. Metal work functions are not shifted as easily as in polysilicon. Accordingly, there is a need for improved CMOS transistor designs and fabrication techniques by which the benefits of scaling can be achieved while avoiding or mitigating the poly depletion degradation found in conventional devices.

The references next described appear to involve various further problems in metal gate technology.

"Transistors with Dual Work Function Metal Gates by Single Full Silicidation (FUSI) of Polysilicon Gates" by W. Maszara et al. IEDM 2002: 367-370 describes a 1.7 nm (nanometer) equivalent oxide thickness nitride/oxide dielectric stack on SOI substrate and reports that polysilicon (poly) gates were doped with B (boron) and As (arsenic) for PMOS and NMOS. Additional gate spacers were reported to have been placed after deep s/d (source/drain) implants and before silicidation. Source/drain and gates were asserted to be fully silicided with nickel when 40 nm of nickel (Ni) was used. The authors say that the dopants, originally present in the polysilicon gates, have been segregated ("snow-ploughed") in front of the advancing silicide front. The amount of piled-up arsenic at the top of gate dielectric is a significant fraction of ~1 nm thick Ni—Si—As film, with over 50% of the implanted As does (4e15 cm-2) present in that pack, helping to modify the work function to ~4.5 e.v. (electron volts) compared to pure NiSi reported to be 4.9 eV. Boron was less accumulated, and the reported PMOS work function of ~4.9 e.v. was said to be apparently insufficient to modulate the NiSi work function.

However, among other problems, the silicidation if carried out over too long a time interval will damage the gate dielectric, and if performed over too short a time interval will not consume all the poly nor pile up sufficient dopant superjacent to the gate dielectric to modify a work function. Because of variations in real semiconductor device layers and the conditions of practical manufacturing processes, the critical and hard-to-control nature of this silicidation approach portends substantial manufacturing problems and yield uncertainties that translate into higher costs of technology solutions. Fully-silicided (FUSI) implementations have work function sensitivity to the silicide phase, metal diffusion into the oxide at high temperature, and material phase sensitivity to reaction/anneal temperature problems. The aforementioned problems and uncertainties can be expected to increase as workers consider how to address the challenges posed by sought-after processes with thinner layers of gate dielectric, narrower channel widths, and smaller gate dimensions.

U.S. Pat. No. 6,696,333 "Method of Making Integrated Circuit with MOSFETs Having Bi-Layer Metal Gate Electrodes" to Zheng et al. According to the patent, FIG. 4 suggests preparing a poly gate and spacers for PMOS and then removing the poly gate and then putting in a thin layer of tantalum nitride (TaN) metal formed over the surface of the partially completed integrated circuit, including over interior walls of sidewall spacers and over a gate dielectric layer. Then a second metal layer is formed over the TaN, said to typically be nickel, platinum, palladium, or other conductive material providing desirable work function. This is called gate replacement. Subsequently, an NMOS FET has its gate electrode such as silicide over poly removed down to substrate. Then a gate dielectric is put on, followed by a first layer of TiN (titanium nitride) 20 angstroms thick more or less. Then a second metal layer is formed, such as aluminum, titanium, or other conductive material with the desired work function. The reference says it is desirable that the TiN layer act as an effective barrier to diffusion of atoms from second metal layer into gate dielectric and also to overcome the carrier depletion effect at the gate/gate dielectric interface typically experienced with polysilicon gate electrodes ("poly depletion").

However, this reference seems to require a very large number of steps to complete the gate replacements and various patterning, etching and layer formation steps to provide the various layers of differing materials for the complementary transistors successively and is believed to pose a risk of unavoidably damaging the underlying gate dielectric during poly gate removal or introducing further complication of removing and reforming the gate dielectric itself.

U.S. Pat. No. 6,373,111 says that P-channel FETS may include Pd/TiN (palladium-TiN) bi-layer. The TiN is called a work function modulation layer and different thicknesses are said to modify the work function, and consequently the threshold voltage of the transistor can be modified.

However, among other problems this reference would imply that multiple process steps would be needed to pattern, etch, and lay down the different work function modulation layers with either different materials or different thicknesses, or both, and such complications are believed to pose a risk of difficulty in thickness uniformity control across the wafer.

It is desirable for these problems and others to be ameliorated or solved in metal gate CMOS.

SUMMARY OF THE INVENTION

In one process form of the invention, a process for making integrated circuits with a gate, uses a doped precursor on barrier material on gate dielectric. The process involves totally consuming the doped precursor thereby driving dopants from the doped precursor into the barrier material.

In another process form of the invention, a process for making integrated circuits with a gate uses doped silicon-based precursor on first metallic material on gate dielectric on a substrate having source/drain areas. The process includes partially siliciding the doped silicon-based precursor and the source/drain areas with a second metallic material, and subsequently siliciding only the partially-silicided silicon-based precursor totally with an additional metallic material.

In still another process form of the invention for making integrated circuits with shared processing of NFETs and PFETs, the processing includes, forming one gate dielectric for NFET and PFET, forming one barrier layer for NFET and PFET, forming one silicon-based precursor on the barrier layer for NFET and PFET, and siliciding the silicon-based precursor totally for NFET and PFET concurrently.

In one integrated circuit form of the invention, an integrated circuit has a gate dielectric, a doped metallic barrier material on the gate dielectric, and metal silicide on the metallic barrier material.

In another integrated circuit form of the invention, an integrated circuit with NFETs and PFETs includes a gate dielectric having substantially the same composition and substantially the same thickness for NFET and PFET. Further included is a metallic barrier material on the gate dielectric, the metallic barrier material having substantially the same composition and substantially the same thickness, but different doping, for NFET and PFET. Also further included is a metal silicide on the metallic barrier material, the metal silicide having substantially the same composition and substantially the same thickness for NFET and PFET.

In a system form of the invention, a wireless communications device includes an antenna, a radio frequency circuit coupled to the antenna, a digital baseband circuit coupled to the radio frequency circuit. The digital baseband circuit includes NFETs and PFETs having a gate dielectric having substantially the same composition and substantially the same thickness for NFET and PFET, metallic barrier material on the gate dielectric, the metallic barrier material having substantially the same composition and substantially the same thickness, but different doping, for NFET and PFET, and metal silicide on the metallic barrier material, the metal silicide having substantially the same composition and substantially the same thickness for NFET and PFET.

Other integrated circuits, transistors, systems and processes of manufacture are disclosed.

DETAILED DESCRIPTION OF EMBODIMENTS

Figure 1A:
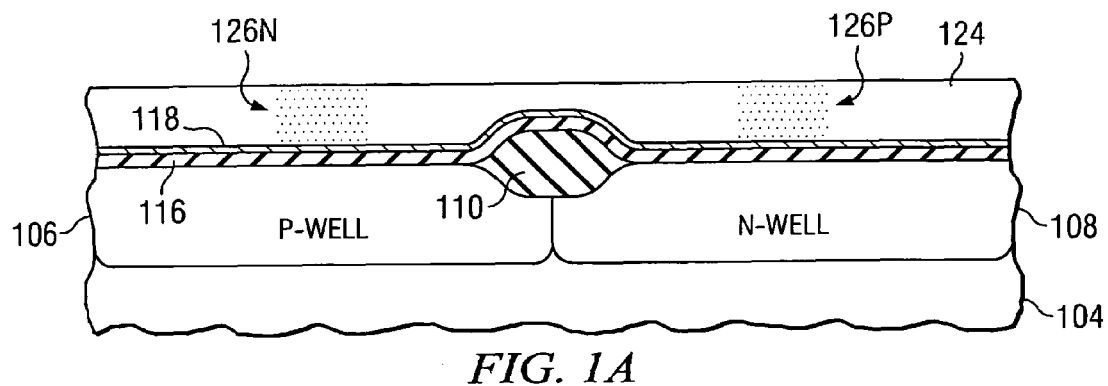
FIGS. 1A, 1B, 1C, 1D, 1E, 1F, and 1G are each cross-sections of a silicon substrate, showing inventive layers, arrangements, transistors and compositions developed sequentially by performing another inventive process embodiment.

Various embodiments support wafer fabrication and processes of integrated circuit manufacture. Embodiments are described with reference to the attached drawings, wherein like reference numerals are used to refer to like elements throughout, and wherein the illustrated structures are not necessarily drawn to scale.

Where processing is illustrated and described below as a series of acts or events, it will be appreciated that contemplated variations thereon are not limited by the illustrated ordering of such acts or events. For example, some acts may occur in different orders and/or concurrently with other acts or events apart from those illustrated and/or described herein, as the skilled worker may elect. Not all illustrated process steps are necessarily required to implement a process embodiment. Further, the processes suitably produce herein-described structures and other structures. The processes may be accompanied by other processes and other alternative or additional structures.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range plus/minus 20% are comprised relative to the value of each subscript. Such varied values do not necessarily sum to a whole number and this departure is contemplated. Such variations may occur due to either intended selection and control of the process conditions, or due to unintended process variations.

Preliminary Processing and Layer Formation

In FIG. 1A, a process embodiment begins by providing a wafer having substrate 104 which is suitably silicon or silicon on insulator (SOI). "Substrate" herein alternative includes any of the following: i) wafer bulk silicon, or ii) wafer bulk silicon with epitaxial silicon thereon, or iii) layer of silicon germanium (SiGe), or iv) silicon on insulator on substrate, or v) SiGe on insulator on substrate, or vi) other suitable material(s) preparatory to subsequent layer deposition. Adjacent P-Well 106 and N-Well 108 are formed such as by patterning of the substrate 104 and diffusion or implantation of respective P-dopant and N-dopant into substrate 104. Further patterning and oxidation provides field oxidation (FOX) 110. Formation of isolation structures such as field oxide (FOX) in field regions of a device wafer utilizes LOCOS (Local Oxidation of Silicon), STI (Shallow Trench Isolation), or any suitable isolation processing.

Channel processing in a first embodiment is advantageously omitted, and no Vt implant is made for either the NMOS nor PMOS channel region. In a second embodiment a Vt implant is provided in the NMOS channel region. In a third embodiment a Vt implant is performed on the PMOS channel region. In a fourth embodiment, different Vt implants are performed on the NMOS and PMOS channel regions respectively. In a fifth embodiment, identical Vt implants are performed on the NMOS and PMOS channel regions concurrently.

As described earlier hereinabove, the Vt implant adjusts the work function of a channel region. In embodiments for which channel processing is chosen or added, the NMOS channel processing includes, for example, a shallow Vt adjust implant to introduce boron or other p-type dopants into the NMOS channel region with the PMOS region masked, a boron punch-thru implant to suppress punch-through, and a somewhat deeper boron channel stop implant. Conversely, an analogous Vt adjust implant for PMOS is suitably provided in such embodiments.

Next a gate dielectric 116 is advantageously provided as one identical layer for both the subsequent fabrication of P-FETs and of N-FETs. For example, a single thermal oxidation is performed to create a thin $SiO_2$ gate dielectric oxide overlying the substrate in the NMOS and PMOS regions. In general, the gate dielectric is concurrently formed in both the NMOS and PMOS regions using any suitable materials, material thicknesses, and processing steps, including a single thermal oxidation or deposition or combinations thereof to form a gate dielectric above the semiconductor body, which may be a single layer or multiple layers. Separate processing is suitably employed to form different gate dielectrics in the NMOS and PMOS in alternative embodiments. Depending on the material selected, gate dielectric 116 is also suitably provided by spin-on technique, magnetron sputtering, ion-beam sputtering, chemical vapor deposition (CVD), or other suitable method.

The gate dielectric material is suitably selected from and formed of any of silicon dioxide $SiO_2$, silicon nitride $Si_3N_4$, silicon oxynitride SiON, high-k dielectrics, and stacks, mixtures, or combinations thereof, including but not limited to:

binary metal oxides including aluminum oxide ($Al_2O_3$), cerium oxide ($CeO_2$) zirconium oxide ($ZrO_2$), hafnium oxide ($HfO_2$), lanthanum oxide ($La_2O_3$), yttrium oxide ($Y_2O_3$), tantalum oxide ($Ta_2O_5$), titanium oxide ($TiO_2$), and tungsten oxide ($WO_3$), as well as the silicates and aluminates of each of the foregoing metals, as well as more complex materials such as barium strontium oxide ($Ba_{1-x}Sr_xTiO_3$), and bismuth silicon oxide ($Bi_4Si_2O_{12}$).

metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, etc.

perovskite-type oxides including a titanate system material such as barium titanate ($BaTiO_3$), strontium titanate ($SrTiO_3$), barium strontium titanate (BST: $Ba_{1-x}Sr_xTiO_3$), lead titanate ($PbTiO_3$), lead zirconate ($PbZrO_3$), lead zirconate titanate (PZT: $PbZr_xTi_{1-x}O_3$), lead lanthanum zirconate titanate, barium lanthanum titanate, barium zirconium titanate, lead zirconium nitride (PZN: $Ba_{1-x}Sr_xTiO_3$ $Ba_{1-x}Sr_xTiO_3$ a niobate or tantalate system material such as lead magnesium niobate (PMN: $PbMg_xNb_{1-x}O_3$), lead zirconium niobate (PZN: $PbZr_xNb_{1-x}O_3$), lithium niobate, lithium tantalate, potassium niobate, strontium aluminum tantalate and potassium tantalum niobate, barium strontium niobate, lead barium niobate, barium titanium niobate perovskite system material such as strontium bismuth tantalate, bismuth titanate, lead scandium tantalate (PST $PbSc_xTa_{1-x}O_3$) and others.

The result so far of the steps in FIG. 1A is a structure 104, 106, 108, 110, 116 ready for gate stack deposition and subsequent processing thereafter.

In FIG. 1A, the process embodiment continues with deposition of a metallic barrier layer 118 of preferably substantially uniform thickness on the gate dielectric 116 and humps of FOX 110. Advantageously, this layer 118 is deposited in a single step preparatory to and providing one same identical barrier layer 118 for the fabrication of different N-FETs and P-FETs. Thus, after gate oxidation is provided a thin layer 118 of thermally stable metal (e.g. titanium nitride TiN or titanium carbide TiC, or metal compound, or mixtures of the foregoing) is deposited and followed by polysilicon. The thin layer 118 is provided by a deposition process such as chemical vapor deposition CVD, plasma vapor deposition PVD, atomic layer deposition ALD, or other suitable deposition process. TiN has a "midgap" work function of 4.65 e.v. (electron volts), meaning that the work function is midway between the 4.1 e.v. top of the valence band of undoped silicon and the 5.2 e.v. bottom of the valence band of undoped silicon.

The thin barrier layer 118 is formed above the gate dielectric 116 in an NMOS region, and the same barrier layer 118 material or compound is formed on and above the gate dielectric 116 in a PMOS region. Although these portions of the barrier layer and the gate dielectric may in some embodiments be formed by separate processes for the NMOS and PMOS regions, the description emphasizes the simplicity of using the same barrier layer 118 for all the transistors.

The barrier layer 118 material is suitably a metal nitride, metal carbide, or metal boride. For the present purposes, "metal nitride" includes any composition of nitride, carbide, and/or boride wherein nitrogen is equally or more predominant than either carbon or boron. Similarly "metal carbide" means that carbon is equally or more predominant that either nitrogen or boron; and "metal boride" means that boron is equally or more predominant than either nitrogen or carbon therein. Further, for example, "metal" nitrides are any materials comprising any metal and nitrogen content, including but not limited to nitrides of titanium, tantalum, other metals, and any of the foregoing in the presence of each other in the composition, metal silicon nitrides, metal aluminum nitrides, and metal aluminum silicon nitrides.

Advantageously, the barrier layer 118 has the same material concurrently deposited by a single deposition above the gate dielectric in both the NMOS region and the PMOS region. The barrier layer 118 as initially deposited has a work function roughly approximating the desired work function. Then the barrier layer 118 is differentially doped for N-FET and P-FET as described below in connection with FIG. 1G, to even more closely achieve or approximate the desired work function matches between barrier layer 118 and channel of N-FET and P-FET respectively. This approach to work function matching eliminates or significantly simplifies channel engineering for one or both NFET and PFET transistor types.

For the barrier layer 118, any metal nitride, metal carbide and metal boride material is suitably used, including but not limited to metals containing nitrogen or metal alloys containing nitrogen, and metals containing boron or metal alloys containing boron, respectively, of any stoichiometry or relative concentrations of metal or metal alloy and nitrogen or boron. The materials may be formed using any metals, ternary metals, or metal alloys, for example, those that include Ti, Ta, Hf, Zr, W, or others. Thus, although illustrated and described in the examples below primarily in the context of titanium nitride TiN, titanium carbide TiC, and titanium boride $TiB_2$, metal nitrides including but not limited to metal nitrides $M_XN_Y$, metal silicon nitrides $M_XSiN_Z$, metal aluminum nitrides $M_XAl_YN_Z$, and metal aluminum silicon nitrides $M_WAl_XSi_YN_Z$ (where M is a metal such as Ti, Ta, Hf, Zr, W, etc.), or equivalents are suitably used. Metal borides include $M_XB_Y$, metal silicon borides $M_XSi_YB_Z$, metal aluminum borides $M_XAl_YB_Z$, and metal aluminum silicon borides $M_WAl_XSi_YB_Z$ (where M is a metal such as Ti, Ta, Hf, Zr, W, etc.). Metal boride nitrides include all the foregoing, with nitride N included in any suitable stoichiometric ratio.

Next, in FIG. 1A, a silicon-based layer 124 of preferably substantially uniform thickness is deposited. By "silicon-based" is meant that layer 124 has a material such as amorphous silicon, crystalline silicon, polysilicon (poly) or other phase or phase mixture of silicon. Silicon-germanium (SiGe) gate is also silicon-based for gate fabrication purposes herein. In the description here, "poly" is repeatedly mentioned (e.g. "poly 124") in a representative way and not exclusive of the other alternatives.

In FIG. 1A, advantageously, this poly layer 124 is deposited undoped in a single step preparatory to and providing one identical layer for the fabrication of different N-FETs and P-FETs. Depositions of dopants are suitably performed sequentially to provide dopants 126N and 126P. Each deposition is suitably, but not necessarily, followed by one identical anneal to anneal and distribute the respective dopant 126N and 126P downward in the poly 124 without substantial redistribution of the dopant laterally from the intended gate stack sites.

In a sequential deposition of poly dopants, patterning of a protective dopant mask layer (not shown) reveals poly 124 of the NFETs. Next, deposit N-type dopant 126N such as arsenic (As), phosphorus (P), other suitable N-dopant, or mixtures thereof. This deposition is suitably, but not necessarily, followed by an anneal to distribute the dopant 126N in the poly 124 for NFETs. Formation of another protective dopant mask layer (not shown), patterning, and removal of the mask layer over remaining areas of the wafer exposes areas in which PFETs are to be formed. Next, deposit P-type dopant 126P, such as boron (B), indium (In), gallium (Ga), other suitable P-dopant, or mixtures thereof on poly 124 for PFETs, and distribute dopant 126P downward as appropriate.

Thus, the poly 124 of FIG. 1A has now been doped with N-type dopant 126N for NFETs and P-type dopant 126P for PFETs. Each dopant 126N and 126P in the poly 124 is suitably re-distributed using a poly anneal process or subsequent DT (diffusivity-time) in the process flow. That anneal is suitably omitted in processes where the poly dopant is already distributed, or where it is unnecessary at this point to distribute the dopant in the poly 124. Removal of any remaining mask material exposes the top surface of the poly 124 with the respective dopant 126N and 126P.

Driving Dopant from Poly into Barrier Layer by Silicidation to Multiply Dopant Concentration Several process examples with different relative timings of silicidation are described later hereinbelow. But first, some description of similarities and advantages among some of the process examples is provided.

At a point in the process that varies among the examples, a layer of thick metal (variously numbered 170, 370 and 670) is deposited onto poly 124. The thick metal layer has suitably, but not necessarily, substantially uniform thickness. Advantageously, this thick metal layer is deposited in a single step that provides one identical layer for the process of fabrication of different N-FETs and P-FETs. The thick metal layer is deposited advantageously thick enough to silicide and totally consume all the poly. The thick metal layer is suitably comprised of a metal (e.g. nickel (Ni), cobalt (Co), platinum (Pt), tantalum (Ta), other suitable metal, metal compound or mixture of the foregoing) and deposited on top of the poly 124 as just described.

The barrier layer 118 is advantageously doped by a special process that drives dopant from poly 124 into barrier 118 and transfers, injects, and multiplies the dopant concentration from the poly 124 to the barrier layer 118. Dopant 126N and dopant 126P respectively reach the NFET and PFET barrier 118 interface with the gate dielectric 116. Dopant dipoles are thereby formed at that interface. The dopant dipoles shift the work function relative to the metal work function of the undoped barrier layer 118, and shift the work function in opposite directions respective to and suitable for work function matching in the respective NFET and PFET.

This process is far more effective than merely annealing poly 124 to diffuse dopant downward. Using poly 124 alone merely to diffuse dopant 126N or 126P therefrom into barrier 118 is less effective because the dopant concentration gradient is not multiplied. Dopant diffusion into barrier 118 is established in rate and relative proportions by the solid solubility of dopant in poly 124, solid solubility of dopant in the material of barrier 118, and dopant trapping at the interface of the poly 124 interface with barrier 118. In other words, the solid solubility of dopant in silicide is so much lower than the solid solubility of dopant in barrier 118, that in this greatly improved snowplow process herein the dopant is injected into and preferentially enters the thin barrier 118 with a concentration many times multiplied relative to its previous concentration in the poly 124 before poly 124 is consumed and transformed entirely into silicide at the former poly interface with barrier 118.

Advantageously, the change in the dopant content of the barrier layer 118, achieved as thus described, respectively tunes the work functions of the resulting PMOS or NMOS transistors and thereby tunes their respective threshold voltages. There is no need of a preceding Vt implant to the channel region. Obviated are the process complications inherent in using two different barrier layer deposition processes and different respective barrier layer materials for NFETs and PFETs.

By contrast, directly implanting dopant in a thin barrier layer 118 is likely to produce recoil damage to gate oxide 116 because attempting implantation here generally involves an extensive depth profile. In other words, an artillery-like process of directly doping the barrier layer by implantation would disadvantageously require the barrier layer to be very thick to prevent dopant penetration into the channel. And if a thick barrier were used, then extreme anneal temperature and long anneal duration would probably be needed to allow diffusion of the implanted dopant throughout the barrier layer. Furthermore, etching of a thick barrier layer may be problematic in gate stack etching.

The PMOS and NMOS source/drains and gates are thus suitably silicided or otherwise enhanced in their conductivity. Silicidation of the source/drains and gates suitably occur in a shared process step or multiple separate process steps, as variously described in detail herein.

Since the gate work function is insensitive to the material phase of the silicide, the silicidation of the poly stack is suitably carried out either during the activation anneal or during a diffusion step separate from the activation anneal. During silicidation, the oncoming front of the silicide downwardly drives the dopant towards the Poly/TiN interface. And upon substantially totally consuming the poly stack, the silicide forces the dopant to diffuse more into the TiN layer, due to low dopant solubility and high dopant diffusivity in the silicide layer.

Since the dopant forms dipoles at the TiN/SiO2 interface, the electronegativity of the dopant (e.g. B, In, As, P, Ga) and the dopant concentration advantageously set the desired work function shift. And since diffusivity of dopant through TiN varies with TiN crystal structure and composition (at a particular silicide temperature), the TiN deposition process is suitably used to affect N-type vs. P-type dopant pileup ratio at the interface. Since dopant dipoles at the interface shifts the work function relative to the metal work function, further work function correction is also suitably made by using different materials (e.g. TiC or TiGe or mixture of any of silicide (Si), carbide (C), or germanium (Ge)) having different intrinsic work functions.

Different temperatures of formation preferentially encourage the formation of different stoichiometric ratios of the same elements in a silicide, and different phases of the same elements in the same stoichiometric ratio in a silicide. Accordingly, the anneal process and temperature(s) thereof are established so that a suicide is formed to have sufficiently low resistivity (ohm-centimeters) and sheet resistance (ohms/square) for advantageous gate resistance. This translates into higher integrated circuit switching speeds and higher supportable maximum clock frequency. In the case of the family of nickel suicides and their phases, the 1:1 stoichiometric ratio silicide of nickel represented by the formula NiSi has a low resistivity and sheet resistance compared to other members of the family. NiSi is preferentially formed at an anneal temperature between 350 (three hundred fifty) and 750 (seven hundred fifty) degrees Celsius, which is a relatively wide range of temperatures in a relatively low temperature band relative to temperatures that degrade silicon dioxide, silicon nitride, and various metal nitrides such as titanium nitride (TiN). Cobalt silicide, platinum silicide, and tantalum silicide are further examples of suicides that share various process advantages in a similar temperature range. For example, cobalt silicide (CoSi) is suitably formed in a range 700-800 degrees C. and for example, at about 750 degrees C. Mixtures of suitable elementary metals, such as those listed and others, can produce other satisfactory silicides.

The silicidation reacts a metal, mixture of metals, or metal compound, with the doped silicon of the doped silicon layer to produce silicide extending to the barrier layer and thereby doping the barrier layer with said at least one dopant from the silicon layer. This reacting thereby alters the work function of the barrier layer compared with the work function of the barrier layer when the barrier was formed in FIG. 1A. Downwardly progressive silicide lies on and superjacent to said doped barrier layer. The silicide has a concentration profile of the same dopant as the doped barrier layer of the same N-type (or P-type) transistor. That concentration profile decreases with distance in the silicide upward and away from the doped barrier layer.

Thickness ratios: In some but not all embodiments as contemplated, these thickness ratios are found: The metallic barrier material has a thickness that is less than one-tenth the thickness of the metal silicide atop the barrier. The thickness of the metallic barrier material, relative to the thickness of the gate dielectric, is greater than half and less than twice the thickness of the gate dielectric. Relatively thin dimensions for the metallic barrier material relative to the metal silicide atop it correspond to high dopant concentration multiplication in the metallic barrier material relative to the dopant concentration in the poly precursor which is consumed in the process of formation of that metal silicide. The gate dielectric is generally relatively thin at the same order of thickness magnitude as the metallic barrier material.

Considerations Regarding Barrier Layer 118

Preferable characteristics to be considered in selecting the material for layer 118 are as follows:

First, thermal stability is desirable, and typically results from a higher minimum temperature that would alter the relevant characteristics of layer 118 after formation of layer 118 compared to the temperature used in forming the poly 124, the thick metal layer (e.g. 170, 370, or 670), and metal silicide (e.g. 180, 380 or 680).

Second, the material of layer 118 should have substantial physical and chemical stability so that when the silicide reaches the material of layer 118, the layer 118 is not substantially disturbed physically by the silicide, nor substantially dissolved into the now-adjacent silicide nor substantially chemically reactive with the silicide. "Substantially" is intended to include some embodiments where the material of layer 118 may dissolve or react somewhat, but without materially losing integrity as a matrix for the dopants. This is what is meant herein by layer 118 being a "barrier layer" or "stop layer." Note that layer 118 is not a barrier to diffusion of dopants, but layer 118 is a substantial barrier to diffusion of silicide (as one instance) into it. In this sense barrier layer 118 is also a selective material for the purposes at hand, and the phrase "selection layer" is used herein to refer to its ability to substantially impede diffusion of silicide and its components into layer 118 and yet to be relatively receptive to the diffusion of dopants, or selective to the passage of dopants thereinto, so that a substantial dopant concentration can be built up therein. The concentration profile of dopant asymmetrically decreases more rapidly in the nickel silicide with distance away from said titanium nitride layer than the concentration profile decreases, if at all, with distance in the thin titanium nitride layer away from the nickel silicide.

Note further that layer 118 can be alternatively formed by a process that lays down a thicker amount of layer 118 material than will remain ultimately, and either contemporaneously or thereupon introduces dopant into it, and then selectively etches, dissolves or removes part of the thickness of layer 118 metal but not the dopant, thereby to increase the concentration of the dopant for work function tuning purposes. Thus, layer 118 is "formed" by processes which encompass a wider variety and scope than simply depositing layer 118 and diffusing dopant into the layer as deposited.

Third, the material of layer 118 should have higher solubility to the dopants which are to enter layer 118 than the solubility of the same dopants in the silicide which has concentrated the dopants superjacently against and delivered those dopants into layer 118. The first, second, and third characteristics just enumerated are suitably interpreted as favoring a material that indeed acts as a selection layer.

Fourth, the material of layer 118 preferably but optionally has a higher solubility to the dopants which are to enter layer 118, than the solubility of the same dopants in the gate dielectric 116 beneath layer 118. In this sense, layer 118 is a "retention layer" as the phrase is used herein, for the dopants. This higher solubility is not required for the present purposes, if the layer 118 is sufficiently thick to support a concentration profile of dopant that substantially declines from the top of layer 118 near silicide 135 to the bottom of layer 118 near the gate dielectric 116 and thereby does not present much dopant to the gate dielectric 116 for diffusion into gate dielectric 116. That being said, the retention layer quality is nonetheless advantageous for layer 118 since a material with high dopant retention relative to the gate dielectric is believed to exhibit less process variation of the work function as tuned by the dopant, and retains and substantially prevents the dopant from diffusion into the gate dielectric. For these reasons, a material with good retention layer quality should also scale well to smaller process dimensions.

Fifth, the material of layer 118 should have a work function that is substantially tunable up, down, or dopant-dependent up or down by delivery of those dopants into layer 118. In other words the doped barrier layer has a work function different from a work function of material of the barrier layer had the material been undoped.

Sixth, the work function should be sufficiently tunable by practical concentrations of the dopants that can be delivered into layer 118 at the silicidation temperature so that the result is an approximate match to the value needed in an N-FET of the work function of layer 118 when doped with the dopant(s) provided in the N-FET poly, and also an approximate match to the value needed in a P-FET of the work function of layer 118 when doped with the dopant(s) provided in the P-FET poly.

Seventh, the material should be sufficiently tunable in work function so that it is not necessary to also vary the composition or thickness of layer 118 to achieve the work functions needed for the application as described in this paragraph.

Advantages of Various Process Embodiments

Some of the advantages conferred by various process embodiments described herein include:

First, since the work function is insensitive to the silicide material phase, the reaction/anneal temperature, even at low temperature, can be selected based on transistor performance optimization.

Second, since the Layer 118 is more thermally stable than the metal silicide, higher temperature and less critical temperature selection can be enjoyed, without incurring silicide reaction with the gate dielectric and/or metal diffusion into the gate dielectric. In other words, since the Layer 118 is more thermally stable than the metal silicide, higher temperature for the silicidation of poly over barrier can be used, as compared to gate silicidation of poly lying on the gate dielectric itself. This is because the barrier layer prevents silicide reaction with the gate dielectric and/or metal diffusion from the metal silicide into the gate dielectric.

Third, since the Layer 118 is more thermally stable than the silicide and is not consumed by contact with the oncoming silicide in the silicide formation, the time interval set for silicide formation in this process can be set conservatively longer than the time interval needed for the suicide to just barely reach the Layer 118. Since there is no poly region, and suicide is used instead, because the poly has been totally consumed by silicidation, the gate resistance is advantageously very low.

Fourth, the strategy of consuming the poly but not layer 118 and of not using gate replacement methodology in some embodiments, obviates a risk of unavoidably damaging the underlying gate dielectric during poly gate removal and avoids introducing further complication of removing and reforming the gate dielectric itself.

Fifth, some of the embodiments very efficiently minimize processing by producing at least some structures for NFETs and PFETs in respective single process steps simultaneously.

Sixth, some of the embodiments very efficiently minimize processing of gate and source/drains by doing at least one double-duty anneal, e.g., to activate dopants and totally silicide the gate simultaneously, or to totally silicide the gate and silicide the source/drains simultaneously.

Consider the silicidation when carried out over a conservatively longer time interval than the minimum which might be needed to just barely reach the Layer 118. The minimum is less than actually needed because all the layers and process steps are subject to real-world variation and thus are not perfectly uniform in their application. Using a longer annealing time interval is thus advantageous in the process, and the exact length of that time interval is less critical. The silicidation, when carried out over the conservative somewhat-longer time interval, will not damage the gate dielectric. Furthermore, elevated temperatures in subsequent processing steps to form the layers above the gates do not interact critically with the results of the process steps that have formed the gates. In summary, the disclosed approach with a barrier layer avoids risks of otherwise performing silicidation over too short a time interval. Too short a time interval is likely to cause the silicidation to consume less than all the poly and thereby physically fall short of the barrier layer. The result would also be to fail to pile up sufficient dopant superjacent to the gate dielectric to modify a work function relatively uniformly over the entire not-perfectly-physically-uniform wafer area.

The process embodiments here described are thus advantageously resistant to variations in real semiconductor device layer thicknesses and the varying conditions of practical manufacturing processes. The resulting product is prepared by fewer process steps, with substantially reduced manufacturing variation concerns and better yields. Obviated in this process is the work function sensitivity that FUSI can show to the silicide phase. Metal diffusion into the dielectric at high temperature is avoided because a lower temperature is used and the Layer 118 layer is more thermally stable. Furthermore, undesirable material phase sensitivity to reaction/anneal temperature is also reduced. The NiSi form of nickel silicide suitably results from processing of the nickel-poly stack at any temperature between about 350 degrees Celsius (three hundred fifty degrees) and 750 degrees C. (seven hundred fifty degrees). NiSi is also midgap at about 400-500 degrees C. (four hundred to five hundred degrees Celsius). The advantages just mentioned are remarkably robust and stable with process migration to ever-smaller processes producing thin layers of gate dielectric less than 20 (twenty) Angstroms, narrow channel widths less than 70 (seventy) nanometers, and small gate dimensions less than 70 (seventy) nanometers.

When preparing CMOS (complementary MOS), which includes both N-FETs and P-FETs, a substantially reduced number of steps advantageously obviates gate replacement steps and much if not all sacrificial processing in the group of process steps focused upon here. Moreover, both N-FETs and P-FETs are suitably made in common by the same fewer steps of patterning, etching and layer formation in the case of the layer 118, the initially undoped poly layer 124, the nickel thick metal layer, and the silicidation anneal that differentially dopes the Layer 118 layer and establishes the appropriately desired work functions. Thus, the steps are reduced because it is unnecessary in case of several of the layers to provide the various layers of differing materials for the complementary transistors successively. Instead, deposition of each of these enumerated layers as a respective single layer does double duty in fabrication both the P-FETs and N-FETs.

In summary, the herein described approaches allow a simple tunable work function gate to be built even at low temperature, without concern about silicide material phase changes at different reaction/anneal temperatures, silicide interaction with oxide or metal diffusion into oxide at high temperature, and silicide thermal stability.

Poly Dopant Concentration

Poly dopant concentration is computed by a four step method, and/or directly determined and confirmed by a series of runs as described in the fourth step below. In that step, the skilled worker performs a series of trial runs with increasing dopant concentration per unit volume in the poly layer followed by complete silicidation of poly to identify the dopant concentration per unit volume of poly which results in the desired value of threshold voltage Vt.

The four-step method describes the mechanisms and relationships which are involved:

1) First, determine from application requirements desired value(s) of gate-to-source threshold voltage(s) Vt for the p-type and n-type transistor(s) to be formed. A low leakage transistor will have a higher threshold voltage magnitude (absolute value of Vt, or |Vt|). A fast transistor will have a lower threshold voltage magnitude (|Vt|). In other words, threshold voltage is not necessarily simply set halfway between the source voltage and drain voltage.

The optimal or ideal gate work function (the gate work function that will give the best transistor characteristic) for long channel transistors is likely to be different from that optimal or ideal gate work function for short channel transistors.

Due to short-channel-effects, the gate work function that give the best transistor characteristic may be different in energy (eV) than that for a long channel transistor. The work function is, of course, a property of the material alone. Advantageously, the gate work function is set (by changing the barrier layer material properties herein by doping) to an energy level that will give short channel transistor the best performance considering that the gate field in a long channel transistor extends deeper or otherwise has a different shape, and therefore the on-off characteristics of the transistor are appropriately tuned by appropriately setting the gate work function.

The gate work function is almost always never matched to the channel work function (in the sense of arithmetic equality of work function energy values). They are generally offset somewhat. P-FET work function match and N-FET work function match are equally important in work function setting. Since the embodiments described herein set the work function between NMOS and pMOS independently, the work functions are advantageously set based on their optimal point.

Work Function Offset: The work function offset is the reverse in PFET as compared to NFET. The work function for n-doped material (the n+ poly gate for NMOS or n-doped barrier 118 herein for NFET or n substrate for pMOS) is around or close to 4.1 eV, and the work function for p-doped material (the p+ poly gate for pMOS or p-doped barrier 118 herein for PFET or p substrate for nMOS) is around or close to 5.2 eV. Accordingly, some of the embodiments herein provide doping for the barrier layer 118 that is 4.1 eV plus or minus 0.2 eV for the NFET and 5.2 eV plus or minus 0.2 eV for the PFET. Therefore, in most cases, the optimal gate work functions respective to NMOS and pMOS are believed to be different by about 1 eV plus or minus 0.2 eV.

With some embodiments herein, the channel implant for Bulk CMOS Vt adjust is advantageously omitted. However, channel engineering to some extent is utilized using pocket dose or halo implant, because there is only one gate workfunction for both long and short channel. A pocket implant or halo implant is an implant that is established in the channel beneath and around the gate to create non-uniform doping in the channel. By contrast, a Vt implant has the channel doping concentration is uniform across the gate length. Therefore, it is difficult to have a single workfunction that is optimal for both long channel and short channel. Accordingly, optimize the workfunction for short channel transistor using a pocket dose and use Vt adjust for long channel. If the long channel Vt value is flexible in the transistors to be fabricated, then the Vt adjust is not needed.

For SOI (silicon on insulator), all channel engineering is advantageously omitted so that there is no dopant in the channel (neither pocket dose nor Vt adjust). This contrasts with the case for bulk CMOS where pocket dose is preferable. In SOI the reason the gate work function can be the same same in long and short channel transistors when in bulk CMOS the gate work function is different is as follows. In SOI, the drain electric field is, ideally, shielded by the gate or bulk plane. Thus the channel can have, ideally, no dopant at all (to be sure, this is in an ideal situation), and in this case the Vt is therefore determined by the gate work function.

2) Second. A second step determines the dopant concentration per unit area at the barrier layer (e.g., TiN) interface with the gate dielectric which tunes the work function to establish the desired value of gate-to-source threshold voltage Vt for the p-type or n-type transistor to be formed. This dopant concentration establishes charge dipoles at the interface. Higher dopant (e.g. boron) concentration per unit area at the barrier layer interface with gate dielectric decreases the negative threshold voltage in a p-type transistor to be less negative. Higher dopant (e.g. arsenic) concentration per unit area at the barrier layer interface with gate dielectric decreases the positive threshold voltage in an n-type transistor to be less positive.

It is contemplated that the dopant concentration of boron B or Indium (In) for P-FET is >1E15cm-2 (in probable range 0.5E15 to 3E15cm^-2) at interface surface. Note this is concentration per unit area, not per unit volume. E means "ten-to-the-power-of" dopant atoms. "/cm2" and "cm-2" both mean per square centimeter. Similarly, the contemplated dopant concentration of arsenic As, phosphorus P, or antimony Sb for N-FET is 1.5~2E15cm-2 (in probable range 0.5 to 3E15cm^-2)(again per unit area). Note that the number of dopant atoms per unit volume (/cm3) multiplied by thickness (in cm) equals the number of dopant atoms in the actual volume per a unit area (/cm2).

If this dopant concentration per unit area cannot readily be determined or measured, proceed directly to step 3. It is believed that the dopant concentration relationship to the work function tuning depends on the dopant species, the bonding of dopant to titanium, some clustering of pure dopant concentration, and trapping sites formed at the barrier layer surface, bonding of dopant with gate dielectric chemical elements such as silicon, oxygen, or otherwise, as well as the composition of the gate dielectric, (oxide, oxynitride, precise stoichiometry and material of gate dielectric and of barrier layer, etc.).

3) Third, determine the dopant concentration per unit volume in the barrier layer which produces the dopant concentration per unit area of step 2 that establishes the desired value of threshold voltage Vt. The relationship between these concentrations is approximately linear and increasing. This dopant concentration per unit volume is contemplated to be generally between about 1E20/cm3 and about 1E22/cm3. The determination is performed from physical principles and lab measurements. If the dopant concentration per unit volume cannot conveniently be determined in this way, the skilled worker performs a series of trial runs with increasing concentration per unit volume in the barrier layer to identify the concentration per unit volume which results in the desired value of threshold voltage Vt.

4) Fourth, convert that barrier dopant concentration Db per unit volume into poly dopant Dp concentration per unit volume by multiplying by the ratio of barrier layer thickness Hb to poly layer thickness Hp.

*Dp=Db×Hb/Hp*

For example, in the case of titanium nitride barrier layer and doped poly silicided all the way to the barrier layer, the dopant solubility in the titanium nitride is relatively high compared to the dopant solubility in the silicide above. The formula expresses a relationship wherein increasing poly dopant concentration Dp increases barrier layer dopant concentration Db and vice versa. Increasing barrier thickness Hb, all other things being equal, increases poly dopant concentration Dp needed to produce a given level of barrier dopant concentration Db. Increasing poly thickness Hp before siliciding, all other things being equal, decreases poly dopant concentration Dp needed to produce a given level of barrier dopant concentration Db. Given a level of poly dopant concentration Dp, increasing the poly thickness Hp and/or decreasing the barrier layer thickness Hb increases the barrier dopant concentration Db.

The silicidation temperature is maintained for a sufficient time after the silicidation front reaches the barrier layer to complete the diffusion of the dopant into the barrier layer and uniformly through the barrier layer. The length of time to complete the diffusion decreases with increasing temperature. Diffusivity of a single dopant is faster in very thin film barrier due to larger amount of grain boundaries compared with thicker films having fewer grain boundaries. Where mixtures of two or more dopants are used, the dopants do not diffuse independently but instead can be expected to affect each other's rate of diffusion due to chemical reaction bonding and competition for available diffusion sites.

Partial diffusion to produce varying concentration in the barrier layer can be performed, and the formula above would be correspondingly modified by a multiplicative constant or a decreasing function of time and temperature wherein the function decreases down toward unity with increasing time and temperature. The formula above assumes unity.

In a first example, the poly dopant concentration is established concurrently with doping of the source/drains and the poly to a concentration of about 1E15/cm2 to about 4E15/cm2 (per unit area square centimeters) and a corresponding concentration of about 1E20/cm3 to about 4E20/cm3 (per unit volume cubic centimeters). Assume the barrier layer thickness Hb is 20 Angstroms to 50 Angstroms, and the poly thickness Hp is 800 Angstroms to 1000 Angstroms. This provides a multiplication of 16:1 to 50:1, (While many embodiments are contemplated with high multiplication ratios, "multiplication" for purposes of this description means a ratio at least as much as 1.5:1 (one and one-half to one).) Thus, it is contemplated that the dopant concentration in the poly be on the order of about 1E21/cm3 (1E22/16) down to 5E19/cm3 (1E21/50). More particularly, contemplated boron (B) dopant concentration in poly is suitably approximately 4E20/cm3 near solid solubility of boron in the poly although implanting can alternatively go higher. Also, more particularly, contemplated arsenic (As) dopant concentration in poly is suitably approximately 5E20/cm3 in the poly.

The skilled worker performs a series of trial runs with increasing dopant concentration Dp per unit volume in the poly layer under the process conditions of temperature, gate dielectric composition and thickness, and barrier layer composition and thickness and poly thickness, to determine and/or confirm the concentration per unit volume which results in the desired value of threshold voltage Vt.

Four Categories of Process Examples

In summary, among other process and structure embodiments described herein, four categories of alternative process examples contemplated are designated Categories I, II, III and IV.

I. FIGS. 1A-1G and FIG. 2 illustrate structures and process steps in Category I embodiments, which do a prior higher-temperature activation anneal followed by simultaneous silicidation of gate stack and S/D at lower temperature. In a Category 1A, that simultaneous silicidation begins with enough nickel to produce NiSi monosilicide gate and NiSi monosilicide S/D). Silicidation of the gate poly into nickel monosilicide (NiSi) drives gate dopants into the barrier layer thereby advantageously multiplying dopant concentration relative to the poly precursor. In a Category 1B, that simultaneous silicidation begins with about half as much nickel to produce NiSi2 nickel disilicide gate but still produces NiSi monosilicide S/D. Silicidation of the gate poly into nickel disilicide (NiSi2) also drives gate dopants into the barrier layer thereby advantageously multiplying dopant concentration relative to the poly precursor.

II. FIGS. 3A-3(I) and FIG. 4 illustrate structures and process steps in Category II embodiments wherein the activation anneal step for activating the dopants in the silicon beneath the gate dielectric is the same step in which the silicidation of the gate into nickel monosilicide (NiSi) drives gate dopants into the barrier layer thereby advantageously multiplying dopant concentration relative to the poly precursor. Subsequent nickel deposition on gate and S/D followed subsequently by S/D silicidation at lower temperature results in a lower-resistivity monosilicide NiSi in both the source/drains S/D and somewhat enriches the nickel monosilicide in the gate stack.

Figure 5:
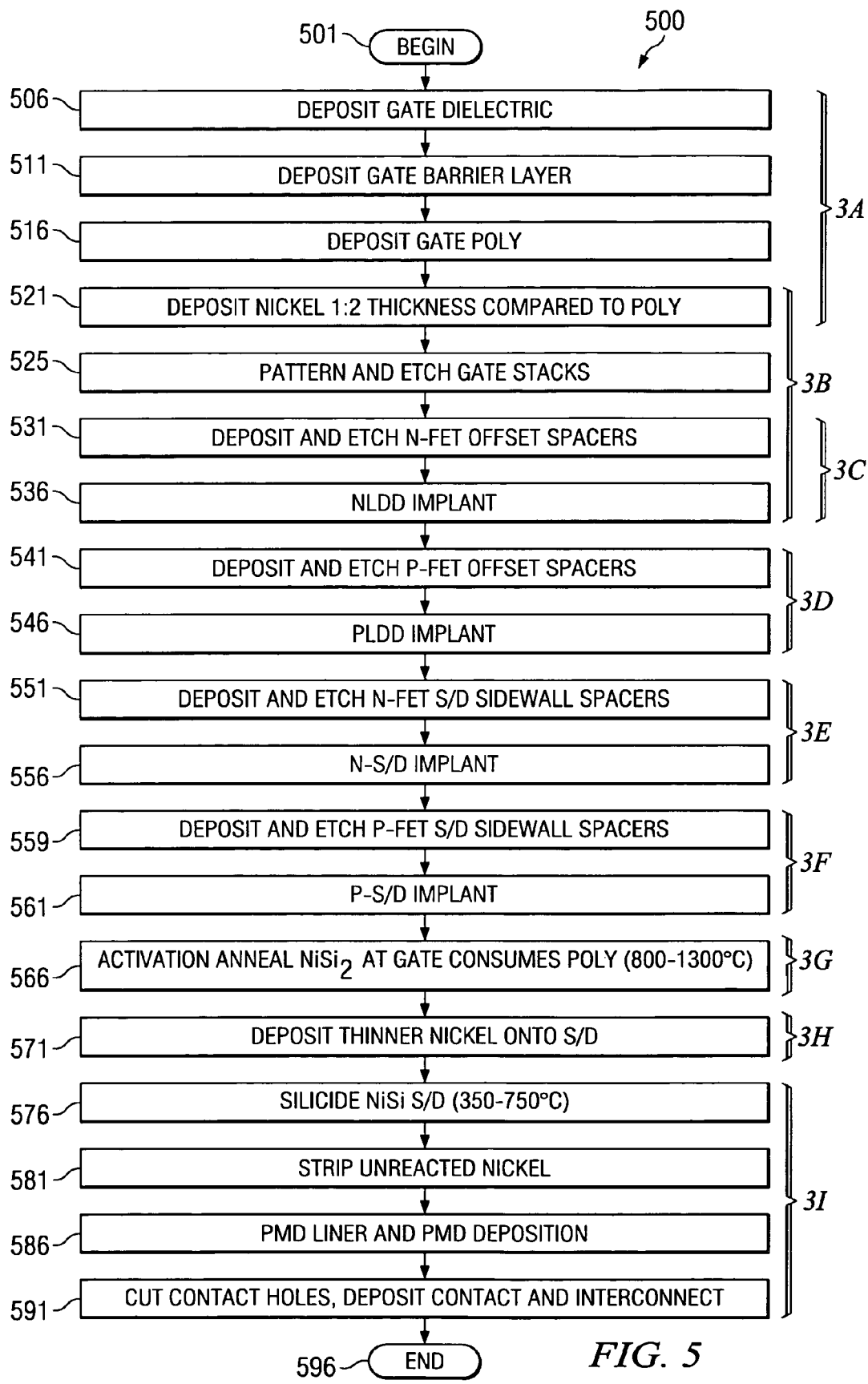
FIG. 5 is a flow diagram of another inventive process embodiment using a disilicide-on-doped-barrier gate related to FIGS. 3A-3(I).

FIG. 5 illustrate structures and process steps in Category III embodiments wherein the activation anneal step for activating the dopants in the silicon beneath the gate dielectric is the same step in which the silicidation of the gate into nickel disilicide ($NiSi_2$) drives gate dopants into the barrier layer thereby advantageously multiplying dopant concentration relative to the poly precursor. In other words, Category III uses activation anneal to do gate silicidation too, to produce nickel disilicide in the gate, but not the S/D. Subsequent nickel deposition on gate and S/D results in a lower-resistivity monosilicide NiSi in source/drains S/D and somewhat nickel-enriches the higher resistivity nickel disilicide gate.

Figure 6A:
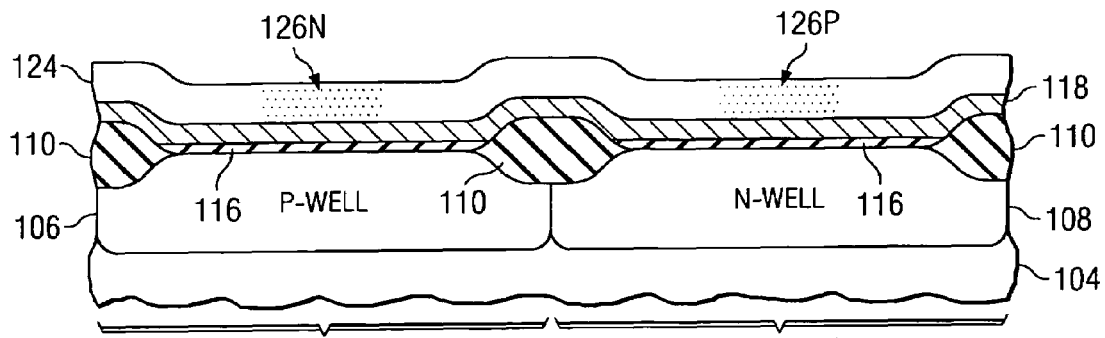
FIGS. 6A and 6B are each cross-sections of a silicon substrate with various inventive layers, arrangements, transistors and compositions developed sequentially by performing an inventive process embodiment.
Figure 6B:
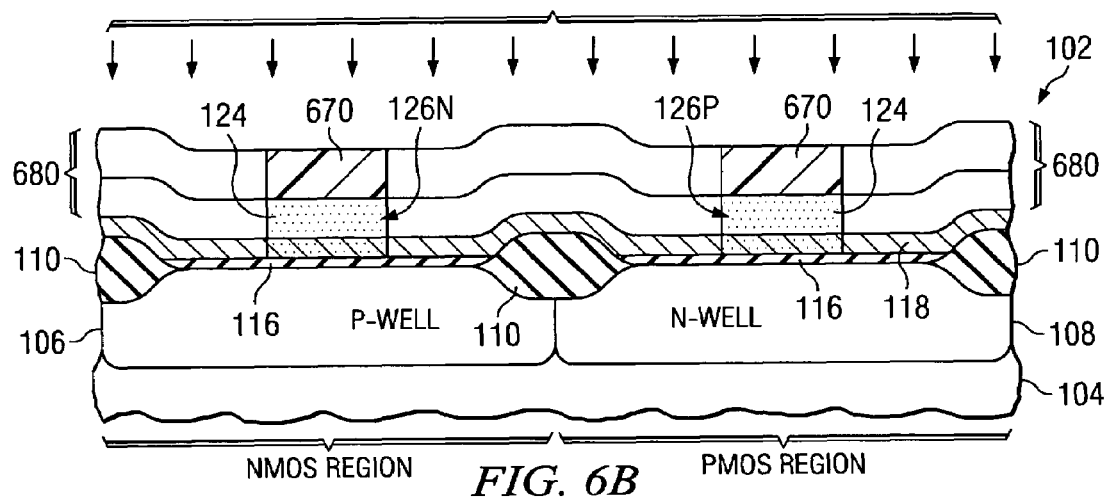
Figure 7:
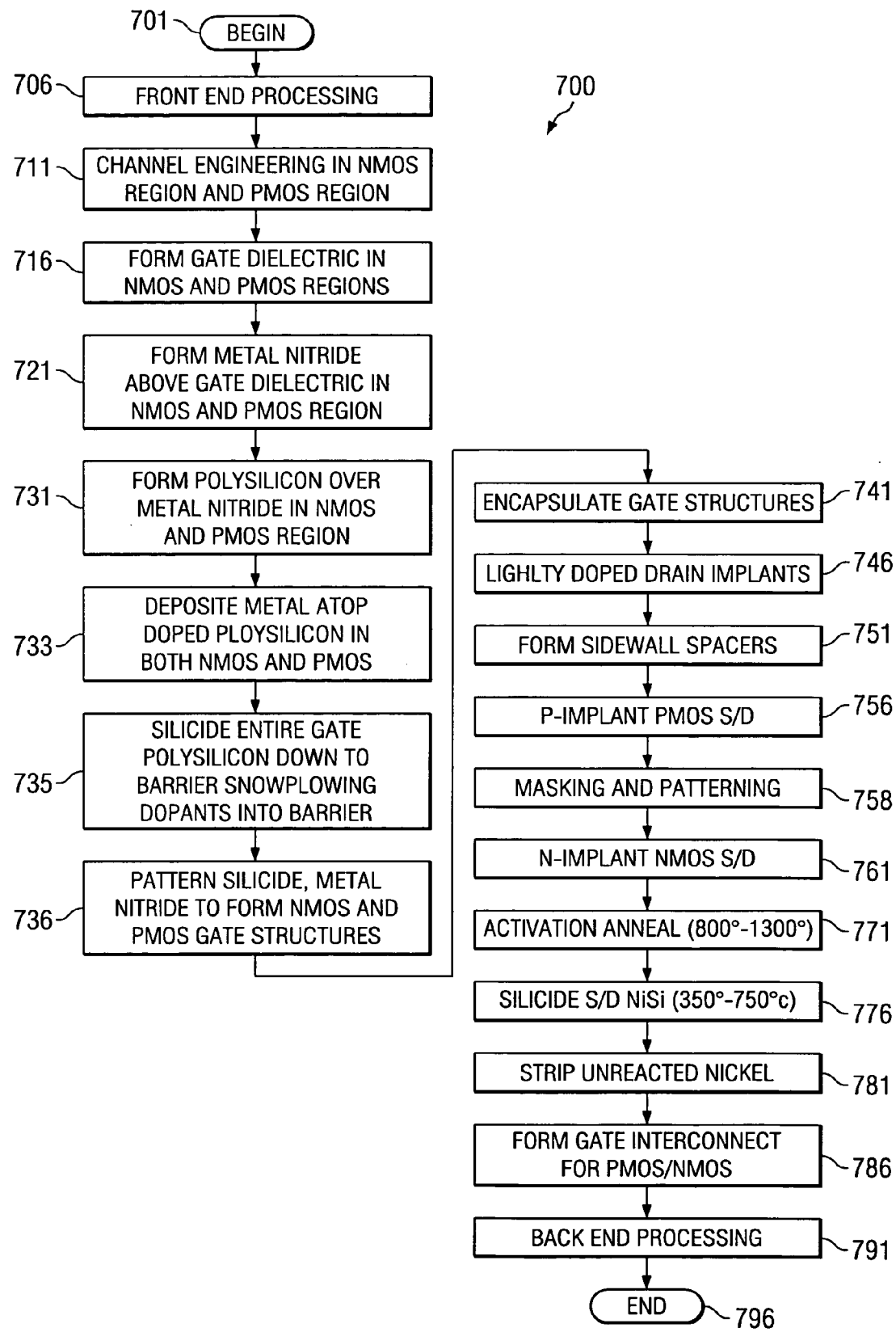
FIG. 7 is a flow diagram of an inventive process embodiment related to FIGS. 6A-6B.

FIGS. 6A-6B and FIG. 7 illustrate structures and process steps in Category IV embodiments wherein prior to etching to form gate stacks, silicidation into nickel monosilicide (NiSi) or nickel disilicide ($NiSi_2$) drives gate dopants into the barrier layer thereby advantageously multiplying dopant concentration relative to the poly precursor. The monosilicide or disilicide type depends on the relative initial thicknesses of nickel and poly layers.

Category I: Lower temperature S/D silicidation anneal also forms NiSi gate and drives dopants into barrier layer. Activation anneal is prior.

Figure 2:
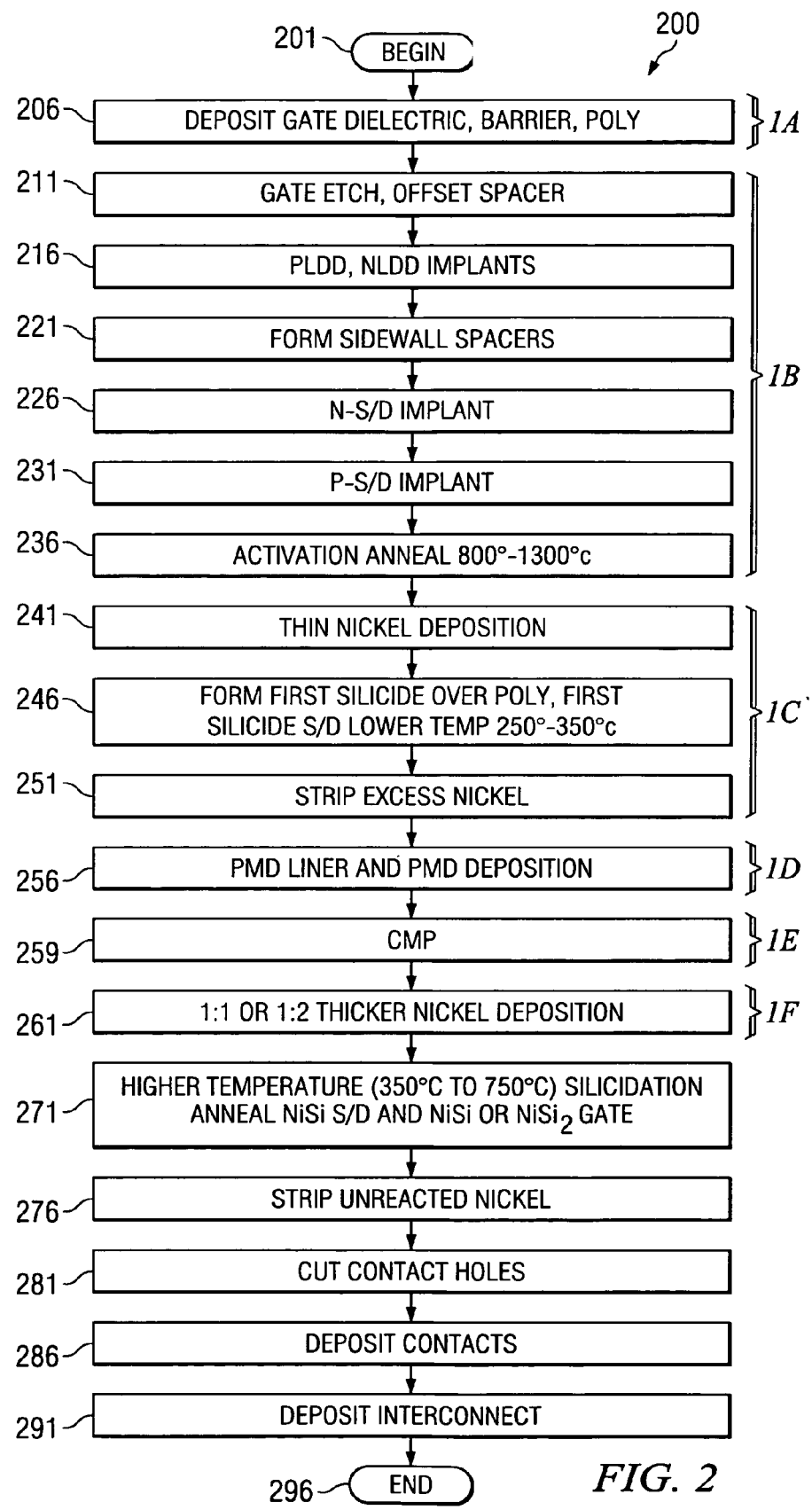
FIG. 2 is a flow diagram of an inventive process embodiment related to FIGS. 1A-1G.

In FIG. 1A and FIG. 2, in a process 200 commencing with BEGIN 201 the gate stack (from bottom to top) of gate dielectric 116, TiN barrier layer 118, and poly 124 are formed in successive substeps of a step 206.

The gate dielectric thickness is established based on considerations of layer uniformity, physical integrity, dielectric constant and electric field strength. The gate dielectric thickness is generally between 5-30 A (five to thirty Angstroms), and somewhat more preferably in the range 5-15 A (five to fifteen Angstroms). For a given field strength, the thickness can be greater than that needed for silicon dioxide when the dielectric constant of a selected gate dielectric material is greater than the dielectric constant of silicon dioxide. The greater the electric field strength needed in the channel, generally the thinner will be the gate dielectric given the same material and same gate voltage.

In FIG. 1A, the TiN barrier layer 118 is suitably in a thickness range 5-30 A (five to thirty Angstroms) and somewhat more preferably in a range 5-20 A (five to twenty Angstroms) with 15 A (fifteen Angstroms) selected for this example.

In FIG. 1A, the poly thickness is suitably in a range 200-2000 A (two hundred to two thousand Angstroms), and somewhat more preferably in a range 400-1200 A (four hundred to twelve hundred Angstroms), with 800 A (eight hundred Angstroms) selected for this example. Dope the poly 124 for the NFET gate areas and PFET gate areas in the poly as earlier described hereinabove in connection with FIG. 1A.

Figure 1B:
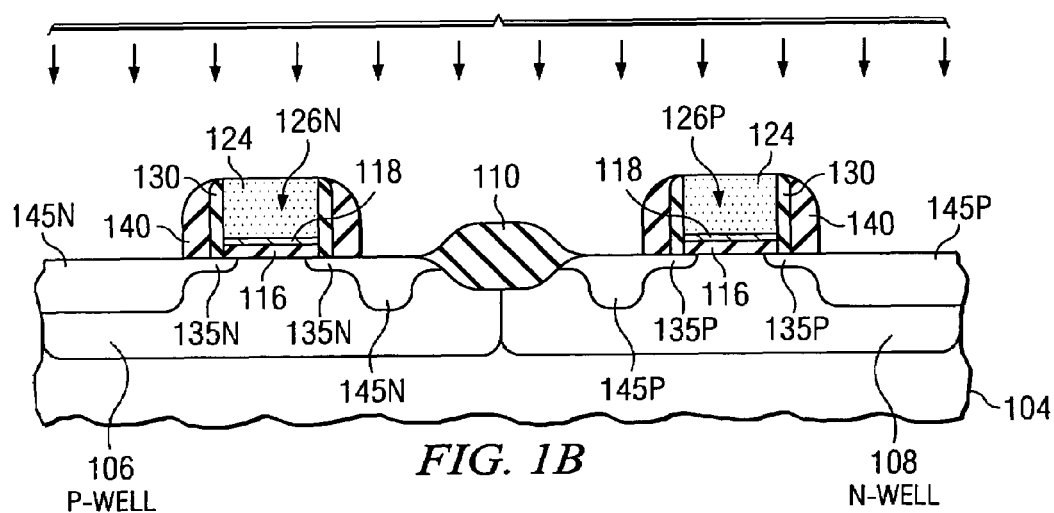

In FIG. 1B and FIG. 2, perform gate etch and apply offset spacer in step 211, LDD in step 216, and S/D spacers in step 221, and S/D implant steps 226 and 231. (These steps are described more fully in connection with FIGS. 3C-3F later hereinbelow.) For example, perform substeps as follows:

a) Gate patterning and etching is performed to reveal each N-FET gate and each P-FET gate. The etch is suitably a dry etch such as reactive ion etching (RIE) that produces very small geometry gate dimensions.

b) Deposit and etch to form the N-FET gate offset spacers 130 and P-FET gate offset spacers 130 concurrently.

c) Perform PLDD (n-lightly-doped-drain) implant 135P.

d) Perform NLDD (n-lightly-doped-drain) implant 135N.

e) Deposit and etch to concurrently form the N-FET S/D spacers 140 laterally of the N-FET gate offset spacers and the P-FET S/D 140 spacers laterally of the P-FET gate offset spacers.

f) Perform N_S/D (n-type source/drain) implant 145N, extending more deeply in FIG. 1B than NLDD 135N.

g) Perform P_S/D (p-type source/drain) implant 145P, extending more deeply in FIG. 1B than PLDD 135P.

h) Further in FIG. 1B, then activation anneal of the silicon substrate is performed in a step 236. This anneal step occurs at a temperature between approximately 800 C where the activation time becomes very long and approximately 1300 C (melting point of NiSi) where the activation time is less than a millisecond. An even more convenient range of temperatures for many process embodiments is 1000-1300 C with times of 5 (five) seconds or less with anneal duration decreasing with temperature. A preferred temperature is about 1000 C (one thousand degrees Celsius) and activation anneal duration about 5 (five) seconds. The 1000 C activation anneal takes place after LDD and SD implant, but before SD silicidation.

Figure 1C:
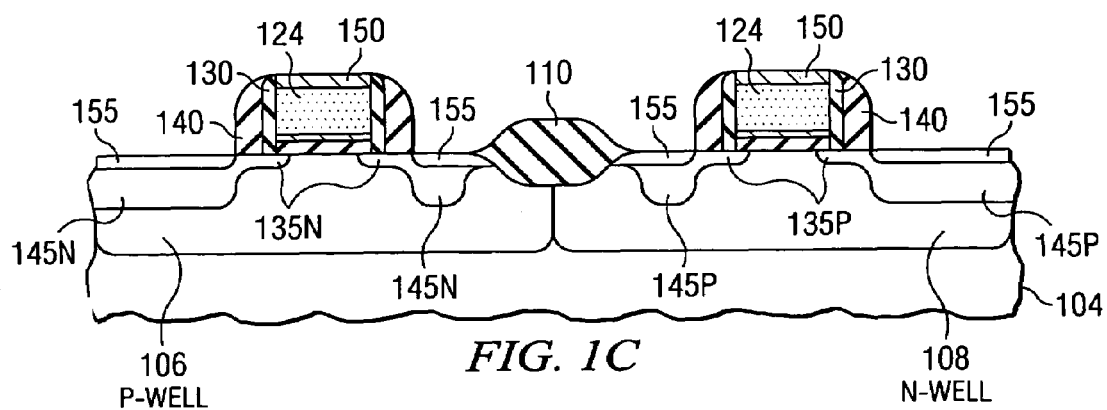

In FIG. 1C, next a) Deposit nickel (not shown except as subsequent partial silicide 150) on the S/D (145N, 145P) and gate poly 124 in a step 241, with the nickel being in the thickness range 20-100 A (twenty to one hundred Angstroms). 55 (fifty-five) Angstroms nickel is selected for this example. b) In a step 246, do a S/D silicidation 155 formation simultaneous with partial silicidation 150 atop gate poly 124. This is a first S/D silicidation anneal of FIG. 1C to be followed up by a second silicidation anneal in FIG. 1G (steps 261, 271). In FIG. 1C and step 246, establish a lower anneal temperature here (lower than in FIG. 1G) suitably at a silicide formation temperature in a range less than or equal .ltoreq.about 350 C. (three hundred fifty degrees), such as the range 250-350 C. (two hundred fifty to three hundred fifty degrees Celsius), with 280 C. (two hundred eighty degrees) selected for this example, for a time duration in the range of about 5-45 sec. (five to forty-five seconds) the best time established from examination of multiple runs. c) Strip excess nickel (not shown) in a step 251 to produce the structure shown in FIG. 1C. At this point the S/D nickel silicide 155 has $Ni_xSi$, where x>1 (nickel atom ratio to silicon exceeds unity). On an upper portion of the gate poly 124, the thin nickel has begun to silicide the upper portion 150 of the gate poly with $Ni_xSi$, including some $Ni_2Si$ formation at the gate. The nickel is too thin to consume much of the gate poly 124 at this point of the process, and the nickel silicide 150 moreover does not come anywhere near consuming all of the gate poly 124.

Figure 1D:
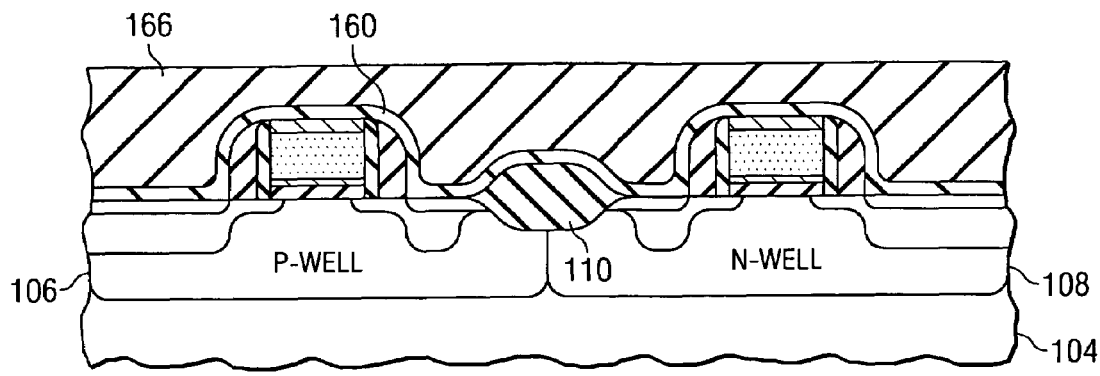

In FIG. 1D, in a step 256 deposit PMD (premetalization dielectric) liner 160 of silicon nitride followed by PMD 166 deposition of silicon dioxide.

Figure 1E:
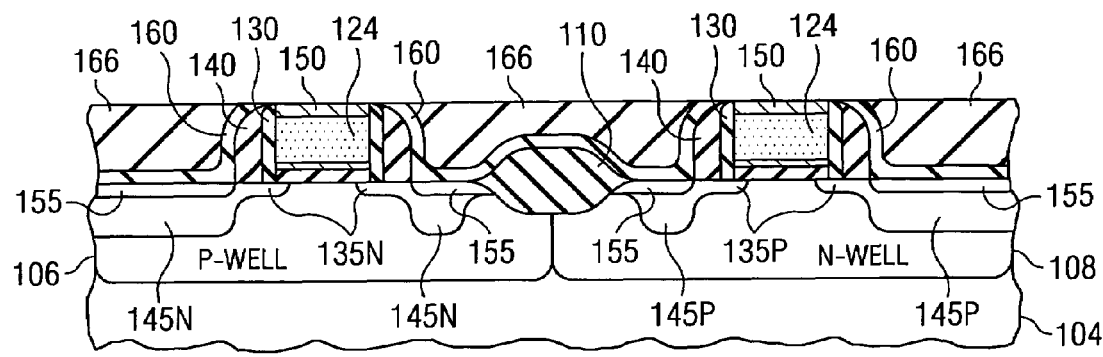

In FIG. 1E, a process step 259 performs CMP (chemical mechanical polish) back to the gate of thin-silicide 150 on poly 124.

Figure 1F:
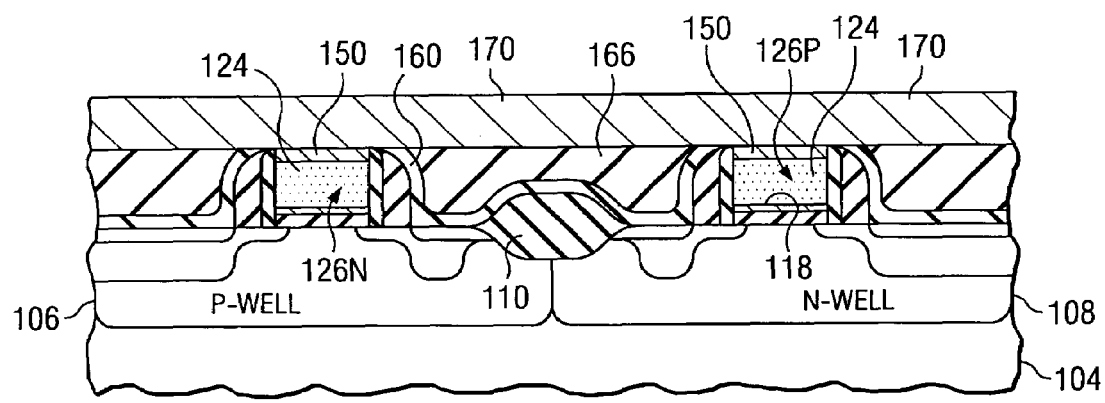

In FIG. 1F, deposit thick nickel 170 in a step 261 on the gate stacks for both the N-FETs and P-FETs concurrently.

For Category I.A. NiSi gate, NiSi S/D), deposit nickel 170 in step 261 to produce about equal (approximately 1:1 ratio) nickel 170 thickness and polysilicon 124 thickness (approximately 500 A in this example FIG. 1A). In other words, compute and provide thicknesses that correspond to a stoichiometric ratio of nickel to silicon of 1:1 so that NiSi (nickel monosilicide) 180 will preferentially form in FIG. 1G.

For Category I.B. (NiSi2 gate, NiSi S/D), deposit nickel 170 in step 261 to produce about half (approximately 1:2 ratio) nickel 170 thickness and polysilicon 124 thickness (approximately 500 A in this example FIG. 1A). In other words, compute and provide thicknesses that correspond to a stoichiometric ratio of nickel to silicon of 1:2 so that NiSi2 (nickel disilicide) 180 will preferentially form in FIG. 1G.

Notice that PMD liner 160 and PMD 166 prevent the just-deposited thick nickel from touching the S/D area.

Figure 1G:
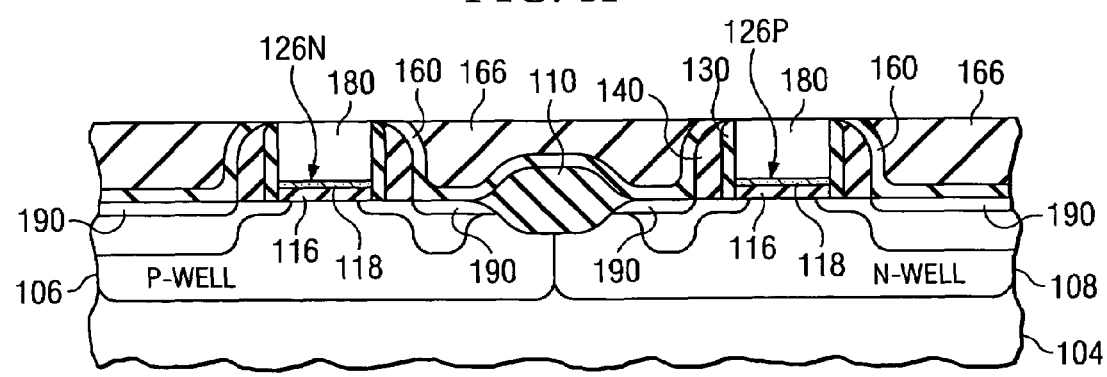

In FIG. 1G and FIG. 2, then anneal as described in below substep a) and in further detail in paragraphs hereinbelow.

a) Category 1.A: anneal in a step 271 to concurrently transform gate Ni$_2$Si (nickel-rich silicide) 150 into NiSi (nickel monosilicide) 180 at the gate and transform the source/drain S/D nickel-rich silicide Ni$_2$Si 155 to nickel monosilicide NiSi 190 at the same time. All the gate poly thus silicided is consumed.

a) Category 1.B: anneal in a step 271 to concurrently transform gate Ni$_2$Si (nickel-rich silicide) 150 into NiSi2 (nickel disilicide) 180 at the gate and transform the source/drain S/D nickel-rich silicide Ni$_2$Si 155 to nickel monosilicide NiSi 190 at the same time. All the gate poly thus silicided is consumed.

b) Follow up by stripping un-reacted nickel 170 in a step 276.

c) PMD (premetalization dielectric) formation step next occurs, followed by cutting contact holes in step 281, and then contact deposition and formation in a step 286 to the source/drains and via formation to top of the gate silicide.

d) Back end process steps 291 include interconnect formation, interlayer dielectric, metallization, passivation, and so forth, are then performed to complete the wafer fabrication.

Advantageously, in this example, no dry etching of either nickel itself or nickel silicide itself is performed in making the gate stack. Instead, CMP step 259 and nickel stripping steps 251 and 276 very satisfactorily remove nickel as described above, and no removal of nickel silicide need be performed at all here. Accordingly, very small and precise geometries are obtainable.

In FIGS. 1C and 1G respectively, S/D silicide undergoes respective anneal steps 246 and 271. These anneal steps are, first, the formation anneal 246 earlier above in FIG. 1C and second, the gate anneal 271 in FIG. 1G that completes the anneal of the S/D as well. The gate stack is thus annealed in FIG. 1G step 271 to consume the poly entirely and convert the gate to NiSi (nickel monosilicide) 180 (Cat. 1.A) or NiSi2 (nickel disilicide) 180 (Cat. 1.B). The TiN barrier bottom layer 118 becomes doped with dopant 126N or 126P driven from the former poly 124 and driven down and diffused into the TiN barrier layer 118.

In other words, silicidation anneal of S/D in FIG. 1G is performed for a second time (first time was in FIG. 1C). Concurrently with and during S/D silicidation anneal in FIG. 1G, there occurs silicidation of gate stack NiSi monosilicide (Cat. 1.A) or disilicide NiSi2 (Cat. 1.B) for the first time. This anneal of FIG. 1G is performed in a temperature range 300-750 C (three hundred to seven hundred fifty degrees), with a somewhat more convenient temperature range 400-600 C (four hundred to six hundred degrees), and temperature 450 C (four hundred fifty degrees) selected for this example. Due to existence of grain boundary in poly, the diffusivity of nickel will be higher, and the nickel silicide formation in the gate will be faster, than in the S/D.

The S/D nickel layer was limited (e.g., to about 50 A) for ultimate NiSi formation at the S/D in FIG. 1G. This obviates or avoids punch-through into the channel which is only about 200 A (twenty nanometers or 0.02 micron) wide in one example. Roughly speaking, the S/D nickel layer thickness here is about a quarter of the channel width. The NiSi formation at S/D is limited to the dimensions of the S/D region itself. If monosilicide NiSi 190 were to penetrate the SD region (known as punchthrough), source-to-drain conduction could disadvantageously occur through the well region or substrate region.

The anneal of FIG. 1G occurs at a temperature (or plural temperatures if different anneal substeps are utilized) generally higher than the anneal temperature(s) of FIG. 1C and generally lower than the activation anneal temperatures(s) used in FIG. 1B substep (h). Silicidation occurs at lower temperature of FIG. 1G, as compared to 1000 degrees C. described in two succeeding embodiments of FIGS. 5 and 7 respectively described later hereinbelow. The lower temperature described for FIG. 1G reduces the diffusion rate into the TiN barrier. To keep dopant diffusion time low, use a thin TiN barrier approximately 20 (twenty) Angstroms (2 nanometers) or less.

The temperature and time period for FIG. 1G gate silicidation step 271 are chosen so that at a given temperature, the time period of the anneal lies in a range 1) bounded at a lower end by a minimum time duration in which the thinner S/D nickel-rich silicide Ni$_x$Si 155 just completes its silicidation into monosilicide NiSi 190 and 2) bounded at a higher end by the time duration in which the S/D nickel monosilicide NiSi 190 begins to so much further extend into the silicon that NiSi$_2$ (disilicide) forms to an extent impairing the desired resistance for the S/D. Nickel disilicide NiSi$_2$ has a higher resistivity than nickel monosilicide NiSi. At a temperature of 500 C a time duration for gate silicidation of about 7 (seven) to 150 (one hundred fifty) seconds lies in a duration range in which S/D nickel just completes NiSi formation 190 to a duration at which the S/D nickel starts forming a significant, but less preferable, amount of NiSi$_2$ (disilicide).

In this process of FIGS. 1A-1G, the activation anneal step 236 of FIG. 1B is separate from and prior to both the initial S/D silicidation 246 in FIG. 1C and the completion of gate and S/D silicidations in FIG. 1G step 271. One low temperature silicidation 271 in FIG. 1G advantageously does double duty for both gate silicidation 180 and S/D silicidation 190 completion. No subsequent S/D silicidation is needed after the FIG. 1G step in which gate silicidation is accomplished.

Further describing the upper end of the time duration range just stated, the time it takes to get the gate fully silicided (NiSi or NiSi2 180 formed instead of poly 124, and dopants 126N and 126P driven into barrier layer 118 for NFET and PFET) is arranged to be less than the time to get source/drain nickel monosilicide (S/D NiSi) (by now it would have transformed from Ni$_2$Si to NiSi) to agglomerate or form islands of NiSi$_2$ disilicide and NiSi monosilicide. Agglomeration means the undesirable progressive formation of higher-resistivity islands of nickel disilicide NiSi$_2$ by migration of nickel further and deeper into the S/D region whereby the stoichiometric proportion of nickel becomes reduced relative to silicon. (Note that, in contrast with S/D, the height of the gate here is sufficient to make the gate resistance with NiSi2 (Cat. 1.B) acceptably low.) Thus, there is a time window or approximate maximum time that the process can operate to get the gate fully silicided (NiSi 180) and drive dopants 126N and 126P into the barrier layer 118 beneath, before the S/D source/drain NiSi monosilicide 190 starts to form into nickel disilicide NiSi$_2$. Therefore, the second anneal time of FIG. 1G is suitably established to be within the time window. The length of the time window decreases as anneal temperature increases. Accordingly, the anneal temperature is established by the skilled worker with the corresponding time window in mind and vice-versa. Thus, both punch-through and agglomeration are advantageously avoided in this embodiment. The process is established so that nickel, migrating as each anneal proceeds, does not penetrate beyond the S/D region, whatever the S/D dimensions. Either microscopic observation of the islands of agglomeration of NiSi$_2$ disilicide, or measurements of resulting increased resistance (or both observation and measurement) suffice to permit the skilled worker to determine when the maximum time is exceeded.

Accordingly, the formation anneal of FIG. 1C gets Ni$_2$Si formed and does not anneal much further, thereby leaving plenty of time for the second anneal of FIG. 1G. In one case, the formation anneal temperature of FIG. 1C is relatively low compared to the second anneal of FIG. 1G (gate silicidation anneal and second S/D anneal), where the examples are 280 C FIG. 1C formation anneal and 450 C FIG. 1G second anneal. In such case, the 280 C formation anneal time, unless made quite extended, does not very much diminish the 450 C time window or time limitation for the second anneal. However, in another case, where both the formation anneal and second anneal are both at 350 C for example, extending the formation anneal much beyond the time for just barely forming the S/D monosilicide NiSi begins to occupy part of the time window. Then the second anneal should be arranged so that the time duration of the second anneal does not exceed the balance of the time remaining in the time window.

Category II: Activation Anneal also Drives Gate Dopants into Barrier Layer to Form Nickel Monosilicide in Gate As noted earlier hereinabove, Category II embodiments advantageously make the activation anneal step for activating the dopants in the silicon beneath the gate dielectric be the same step in which the silicidation of the gate into nickel monosilicide (NiSi) drives gate dopants into the barrier layer. Subsequent nickel deposition on gate and S/D followed subsequently by S/D silicidation at lower temperature results in a lower-resistivity monosilicide NiSi in both the source/drains S/D and somewhat enriches the nickel monosilicide in the gate stack.

Figure 3A:
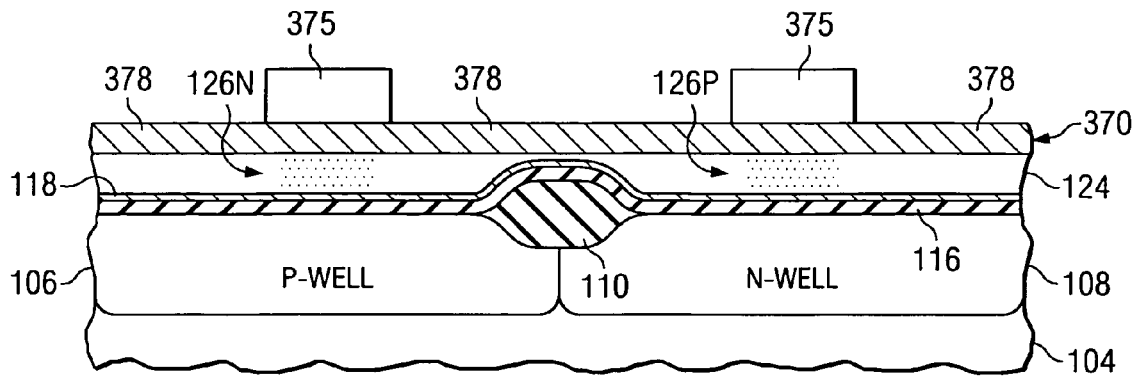
FIGS. 3A, 3B, 3C, 3D, 3E, 3F, 3G, 3H and 3(I) are each cross-sections of a silicon substrate, showing inventive layers, arrangements, transistors and compositions developed sequentially by performing another inventive process embodiment.
Figure 3B:
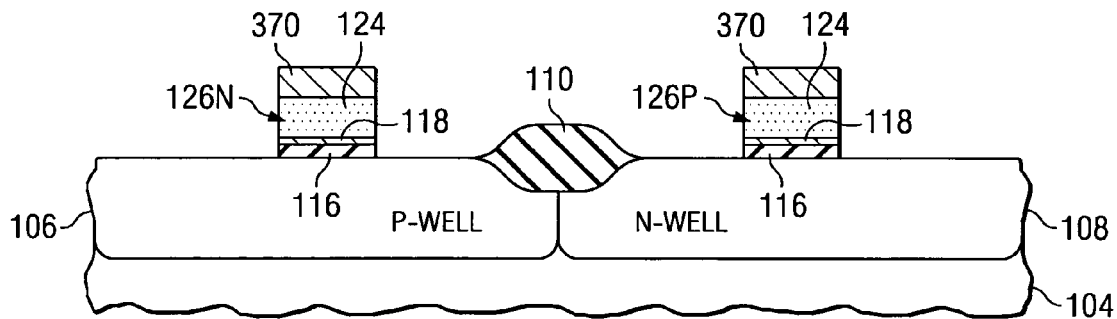
Figure 3C:
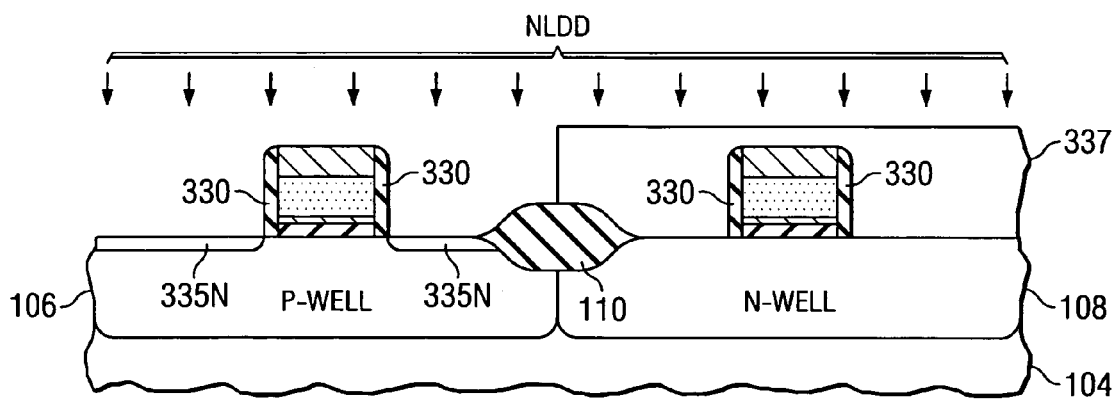
Figure 3D:
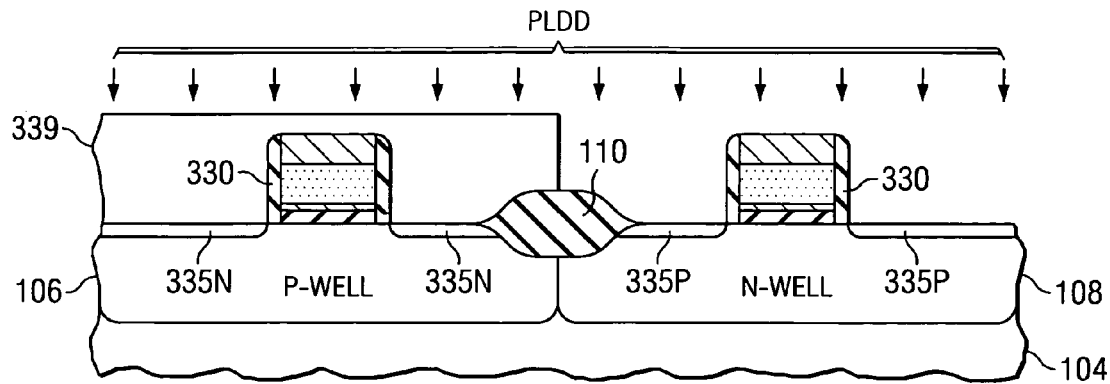
Figure 3E:
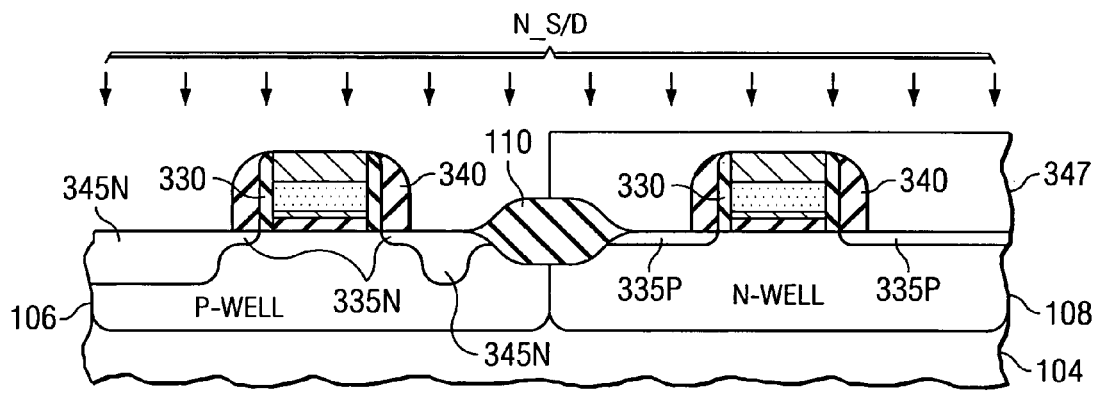
Figure 3F:
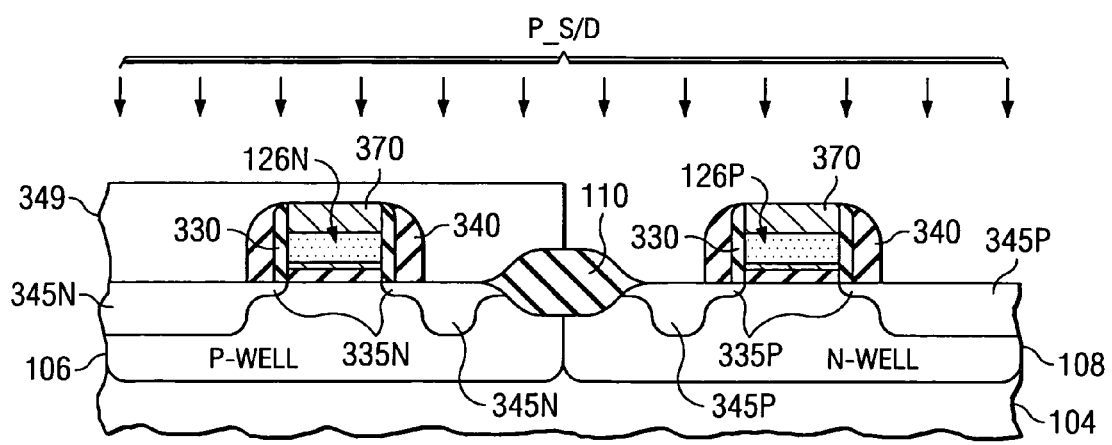
Figure 3G:
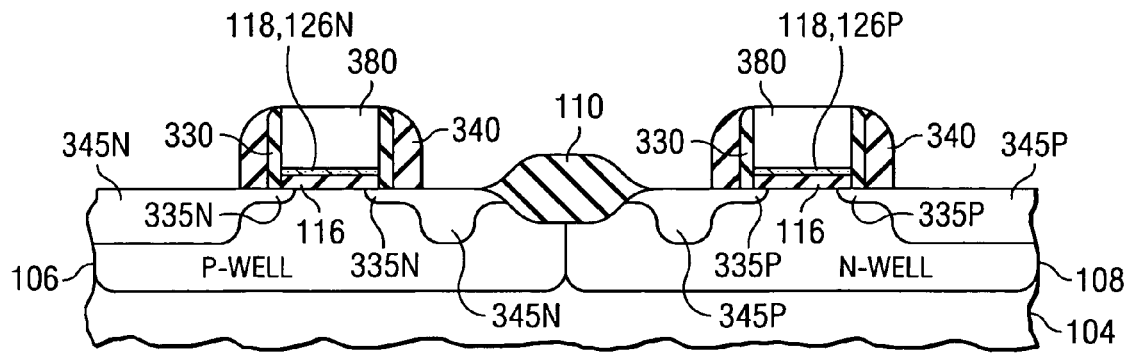
Figure 3H:
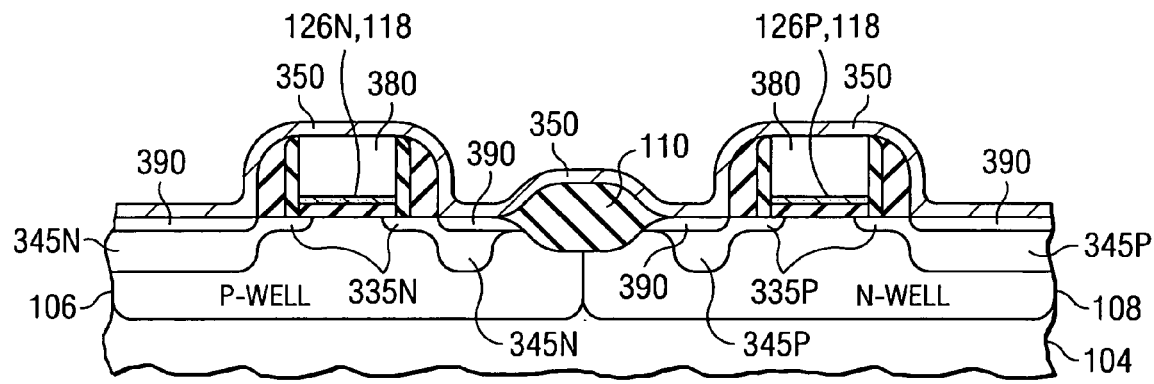
Figure 3I:
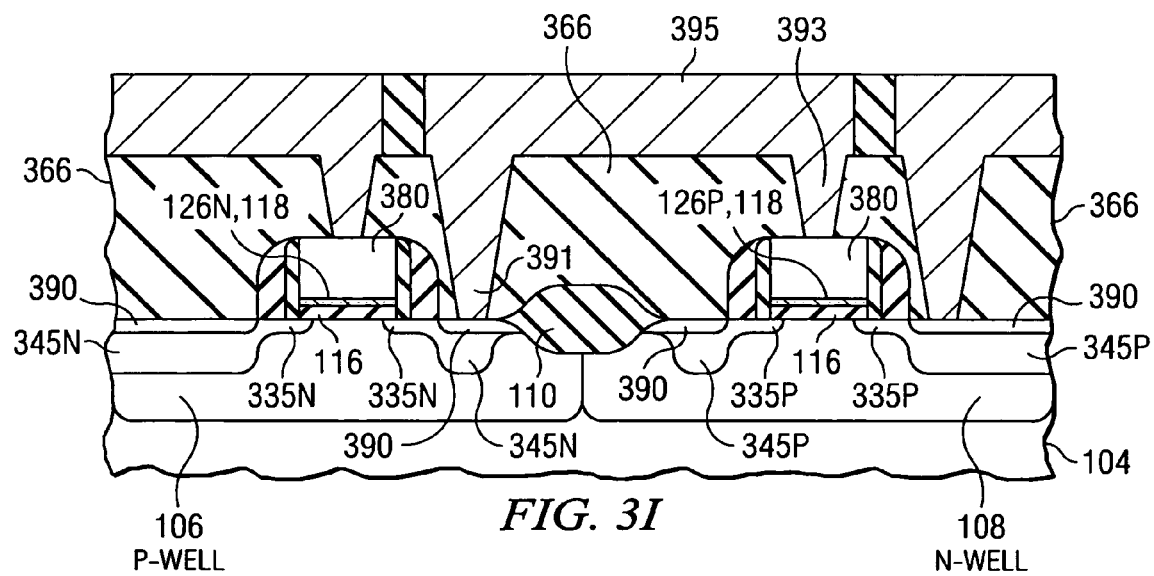
Figure 4:
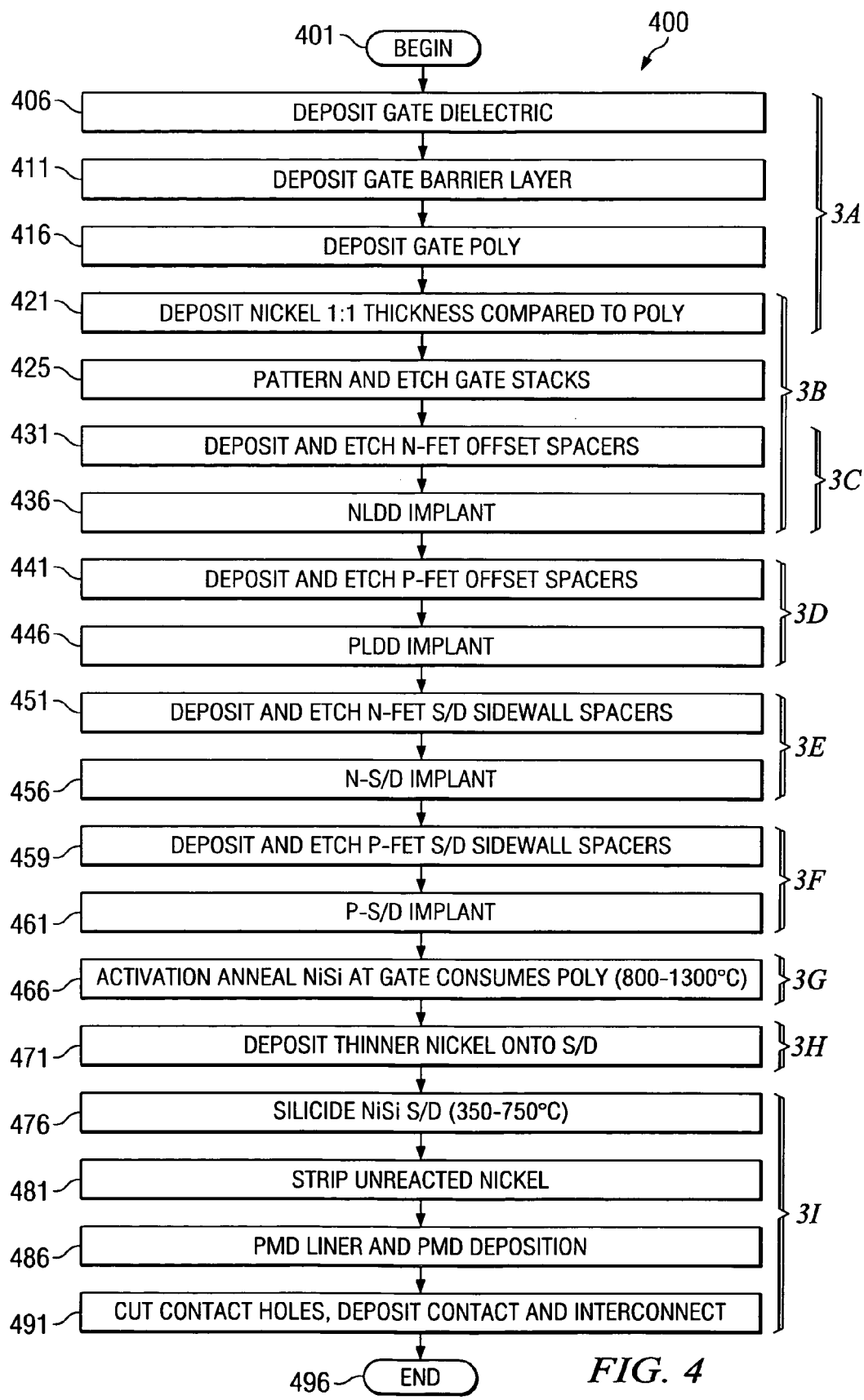
FIG. 4 is a flow diagram of an inventive process embodiment related to FIGS. 3A-3(I).

The description for Category II refers to structures in FIGS. 3A-3(I) and to process steps of FIG. 4 process 400. Some structures are given 300-level numerals numbered to correspond in last two digits with some of the 100-level numerals in FIGS. 1A-1G.

In FIG. 3A and FIG. 4, BEGIN 401 is succeeded by gate dielectric 116 deposition 406, barrier layer 118 deposition 411, and gate poly 124 deposition step 416. Then, a nickel 370 deposition step 421 delivers approximately 1:1 ratio of nickel thickness to polysilicon thickness. For one example, deposit 1000 Angstroms nickel thickness and approximately 1000 Angstroms polysilicon thickness. (To be very exact, compute the thicknesses that correspond to a stoichiometric chemical ratio of nickel to silicon of 1:1 so that NiSi (nickel monosilicide) will preferentially form.) (Note that nickel 370 deposition step 421 occurs in FIG. 3A prior to any S/D processing, by contrast with nickel 170 deposition in FIG. 1F. Note also that "..70" is used in a numeral to indicate thick nickel and not the sequential place in the process sequence which varies among the embodiments.)

In FIG. 3B, gate patterning and etching in a step 425 is performed to reveal each N-FET gate and the P-FET gate. This process embodiment patterns and deeply etches through layers 370, 124, 118 down to the gate dielectric. The following considerations are taken into account in this etch.

Nickel Ni, like platinum Pt and a number of other metals can be dry etched by reactive ion etching (RIE) but the RIE may be slow and may need to be optimized to establish high temperature, high energy and highly reactive ion species to form volatile species whereby the metal that has been etched is appropriately carried away from the layer stack that is being etched to form the gate stacks. Also, nickel Ni has relatively high diffusivity and mobility in silicon (although not volatile or mobile in vacuum), so nickel Ni is either isolated from the channel by introducing or maintaining the presence of intermediate material early in the process, or the nickel is introduced later in the process when such intermediate material is present to eliminate the possibility of junction leakage due to nickel unintendedly reaching the channel. The RIE temperature is selected with due regard to maximum temperature for the selected photoresist or hardmask material overlying the gate stacks.

Accordingly, a two-step wet-dry etch alternative is described below, without diminishing the alternative feasibility and desirability of dry etch of the entire gate stack by RIE as above.

First, the gate areas to be created are overlain with photoresist or hardmask material 375 which is patterned and removed to expose areas 378 of nickel 370 to be wet-etched. Material 375 prevents etching of the gate from above. The nickel is etched down to the poly layer, with the poly acting as an etch stop. The etchant is a highly reactive etchant selected by the skilled worker from choices such as a solution called ammonium peroxide mix (AP), i.e. ammonium hydroxide (NH$_4$OH) and hydrogen peroxide (H$_2$O$_2$) in water, and otherwise any other highly reactive etchant selective between the metal (e.g., nickel) and the poly layer. Note that the wet etch is isotropic. Accordingly, the etch conditions are established to maintain physical integrity and desired dimensions of the nickel above the poly layer.

Second, the poly layer, barrier layer and gate dielectric are dry-etched such as by reactive ion etching (RIE) down to the gate dielectric. A small amount of RIE etching of the nickel top layer advantageously occurs at this point. Concurrently, the gate dielectric protects the channel from any miniscule amount of nickel associated with this RIE substep. Finish up by stripping the gate dielectric material 116 other than the gate dielectric beneath the gate stacks themselves.

In FIGS. 3C-3F, LDD (lightly doped drain) implant and gate sidewall spacer formation are performed.

(Alternatively, refer to description of FIG. 1B hereinabove, substeps b) and e), which describe N-FET and P-FET offset spacers and S/D spacers processed together at the same time.)

In FIG. 3C, deposit and etch in a step 431 to form the both P-FET and N-FET gate offset spacers 330. The offset spacers 330 are produced by forming a layer of insulator 330 such as silicon dioxide, silicon nitride, suitable high-k or other insulators, or mixtures thereof, deposited over the gate stacks for both the P-FETs and N-FETs. Each offset spacer 330 has vertically disposed offset spacer portion 330V and horizontally disposed insulator portion 330H. The offset spacers 330 are advantageously provided for both the P-FETs and N-FETs concurrently in the process. Offset spacer portions 330V are thus provided on the gates laterally and are formed of a dielectric material such as silicon dioxide SiO$_2$ or silicon nitride Si$_3$N$_4$, or other suitable sidewall material, followed by etching. The offset spacers 330 cover the sides of the gate stacks and protect the gate stacks from sideways entry or exit of dopant during subsequent processing operations.

Next, pattern with mask 337 to expose only the N-FET areas. In a step 436, perform an NLDD implant (N-type Lightly Doped Drain) 335N on the N-FET areas using one or more N-dopants such as arsenic, phosphorus, other N-dopants, or mixtures of the foregoing.

Lightly-doped drain (LDD) processing by PLDD and NLDD implants dopants into the source/drains. For example, a PMOS source/drain implant provides p-type dopants or impurities (such as boron B) to the PMOS source/drain region and to the PMOS upper gate layer, while the NMOS region is masked. NMOS source/drain implant provides n-type dopants or impurities (such as arsenic As and/or phosphorous P) to the NMOS source/drain region and to the NMOS upper gate layer, while the PMOS region is masked. The gate stacks advantageously mask the channels during the LDD implantation.

In FIG. 3D, pattern with mask 339 to expose only the P-FET areas. In a step 446, perform a PLDD implant (P-type Lightly Doped Drain) 335P on the P-FET areas using one or more P-dopants such as boron (B), indium (In), gallium (Ga), other suitable P-dopant, or mixtures of the foregoing.

(Alternatively, refer to description of FIG. 1B hereinabove, substeps b and e, which describe N-FET and P-FET offset spacers and S/D spacers processed together at the same time.)

In FIG. 3E, then in a step 451 deposit a layer of insulator and isotropically etch to provide P-FET and N-FET S/D (source/drain) sidewall spacers 340 laterally on either side of the gate stack offset spacers 330. These S/D spacers 340 are deposited using a dielectric material such as silicon dioxide $SiO_2$ or silicon nitride $Si_3N_4$, or other suitable sidewall material, followed by isotropic etching to produce the resulting convex outwardly-curved lateral surfaces of the S/D spacers.

In a step 456, pattern with mask 347 to expose only the N-FET areas perform N_S/D (N-type Source/Drain) implant 345N to heavily dope or otherwise dope the S/D areas with one or more N-dopants such as arsenic, phosphorus, other N-dopants, or mixtures of the foregoing.

In FIG. 3F, in a step 461, pattern with a mask 349 to expose only the P-FET areas perform P_S/D (p-type source/drain) implant 345P. Perform the P_S/D (P-type Source/Drain) implant 345P on the P-FET areas using one or more P-dopants such as boron (B), indium (In), gallium (Ga), other suitable P-dopant, or mixtures of the foregoing. Remove mask 349.

In FIG. 3G, an activation anneal step 466 for activating the dopants in the silicon beneath the gate dielectric is the same step wherein the silicidation of the gate into nickel monosilicide (NiSi) 380 consumes the poly and drives the gate dopants 126N and 126P into the barrier layer 118 to tune the gate work function for NFETs and PFETs respectively. This step 466 occurs at a temperature between approximately 800 C where the activation time becomes very long and approximately 1300 C (melting point of NiSi) where the activation time is less than a millisecond. An even more convenient range of temperatures for many process embodiments is 1000-1300 C with times of 5 (five) seconds or less with anneal duration decreasing with temperature. A preferred temperature is about 1000 C (one thousand degrees Celsius) and activation anneal duration about 5 (five) seconds.

In FIG. 3H, a S/D nickel (or other suitable metal) 350 deposition step 471 covers the now-formed gate (380, 118) and the source/drains of the N-FETs and P-FETs. Then, an anneal 476 silicides the source/drains at silicide 390 to further improve their conductivity. More specifically, deposit nickel 350 on the S/D and gate in step 471, with the nickel 350 being in the thickness range 20-100 A (twenty to one hundred Angstroms). 50 (fifty) Angstroms nickel is selected for this example. Accordingly, deposit about 50 Angstroms nickel onto the source/drains. Then silicide 390 formation is performed in step 476 by next siliciding the source/drains S/D in a temperature range 350-750 C (three hundred fifty to seven hundred fifty degrees Celsius), with a more convenient temperature range 400-500 C (four hundred to five hundred degrees) with preferred temperature 450 C (four hundred fifty degrees). Apply the temperature long enough to produce NiSi nickel monosilicide S/D and not so long as to cause migration of nickel to the point where NiSi2 nickel disilicide forms.

Note above that the earlier activation anneal step 466 of FIG. 3G advantageously does double duty for activation and gate silicidation 380. Then a subsequent S/D silicidation step 476 is performed in FIG. 3H and begins formation of the structure of FIG. 3(I). In FIG. 3H the one same anneal step 476 suffices for not only the S/D silicidation 390 but also further distribution of the dopants 126N and 126P in the barrier layer 118 of both the N-FETs and the P-FETs. The monosilicide composition NiSi is thus used for, and is substantially the same in, both the gate at 380 and S/Ds at 390. Monosilicide NiSi is a low resistivity material, and indeed lower than disilicide NiSi2. Accordingly, the monosilicide NiSi-over-TiN gate produces very advantageously low gate resistance, for very high speed circuitry. Further note, that the mobility of nickel 370 in FIG. 3F from the gate to S/D on activation anneal 466 of FIG. 3G is quite low, so that inadvertent migration of nickel 370 from gate to S/D in the activation anneal 466 of FIG. 3G is of negligible concern. Moreover, in FIG. 3H there actually follows outright nickel deposition step 471 and S/D silicidation 390 with nickel 350, step 476. Therefore, a little of nickel 370 reaching the S/D from the gate in FIG. 3G step 466 is either of no concern or would suggest only some adjustment to the S/D silicidation time of step 476 even if some nickel 370 migration did occur in step 466 of FIG. 3G.

In FIG. 3(I) further subsequent process steps strip unreacted nickel 350 in a step 481, followed by PMD liner and PMD (premetalization dielectric) 366 deposition in a step 486. Follow with steps 491 involving contact 391 formation to the source/drains and via 393 formation to top of the gate silicide 380, followed by deposition of Metal-i layer, and subsequent back-end wafer fabrication steps. Back end process steps include interconnect 395, interlayer dielectric (thereabove, not shown), metallization, passivation, and so forth further above, which are then performed to complete the wafer fabrication. The process is completed at END 496.

Category III: Activation Anneal also Drives Gate Dopants into Barrier Layer to Form Nickel Disilicide in Gate As noted earlier hereinabove, Category III embodiments use the activation anneal step for activating the dopants in the silicon beneath the gate dielectric as the same step in which the silicidation of the gate into nickel disilicide (NiSi$_2$) drives gate dopants into the barrier layer. In other words, Category III uses activation anneal to do gate silicidation too, to produce nickel disilicide in the gate, but not the S/D. Subsequent nickel deposition on gate and S/D results in a lower-resistivity monosilicide NiSi in source/drains S/D and somewhat nickel-enriches the higher resistivity nickel disilicide gate.

The description for Category III refers to structures in FIGS. 3A-3(I) and to process steps of FIG. 5 process 500. Process steps are numbered with 500-level numerals and are described the same as in connection with FIG. 4 corresponding 400-level numerals except as indicated below. For brevity, repetitious description of FIG. 5 where it is the same as FIG. 4 is omitted.

Analogous to FIG. 3A, a Category III nickel deposition step 521 has approximately 1:2 ratio of nickel thickness to polysilicon thickness. Determine the acceptable gate resistance for the application and then derive the gate thickness of disilicide NiSi2 desired. From that gate thickness, derive from their metal properties the starting thicknesses of Nickel and Silicon layers prior to silicidation. For one example, deposit 500 A nickel thickness and approximately 1000 A polysilicon thickness. (To be very exact, compute the thicknesses that correspond to a stoichiometric ratio of nickel to silicon of 1:2 so that NiSi2 will preferentially form with the resulting gate thickness desired.)

Regarding FIGS. 3B, 3C, 3D, 3E, 3F, and 3(I) and FIG. 5, the steps 525-561 and 576-596 and their descriptions are the same in Category III as for the corresponding steps 425-461 and 476-496 in Category II, FIG. 4. Perform gate patterning and etching, do offset spacers, NLDD, PLDD, S/D sidewall spacers, and N-S/D and P-S/D implants.

In FIG. 3G, an activation anneal step 566 not only activates the dopants in the silicon beneath the gate dielectric but also suicides the gate into nickel disilicide (NiSi2), thereby consuming the poly and driving the gate dopants into the barrier layer to tune its work function. This step 566 is performed at a temperature between approximately 800 C where the activation time becomes very long and approximately 1300 C (melting point of NiSi) where the activation time is less than a millisecond. An even more convenient range of temperatures for many process embodiments is 1000-1300 C with times of 5 (five) seconds or less with anneal duration decreasing with temperature. A preferred temperature is about 1000 C (one thousand degrees Celsius) and activation anneal duration about 5 (five) seconds.

In FIG. 3H, in a step 571 deposit thinner nickel on the S/D and gate, with the nickel being in the thickness range 20-100 A (twenty to one hundred Angstroms). 50 (fifty) Angstroms nickel is selected for this example. Accordingly, deposit about 50 Angstroms nickel onto the source/drains. Then in a step 576, perform silicide formation by next siliciding the source/drains S/D in a temperature range 350-750 C (three hundred fifty to seven hundred fifty degrees Celsius), with a more convenient temperature range 400-500 C (four hundred to five hundred degrees) with preferred temperature 450 C (four hundred fifty degrees). Apply the temperature long enough to produce NiSi nickel monosilicide and not so long as to cause migration of nickel to the point where NiSi2 nickel disilicide forms.

Note above that the activation anneal step 566 of FIG. 3G advantageously does double duty for activation and gate silicidation. Then a subsequent S/D silicidation step 576 is performed in FIG. 3H. The gate has a higher resistivity material NiSi2 nickel disilicide than the lower-resistivity monosilicide NiSi material used in the source/drains S/D. This higher resistivity material NiSi2 is acceptable for the gate in this embodiment when the height of the gate (e.g. 100 Angstroms) is sufficient to keep the resulting actual resistance of the gate acceptably low for purposes of the speed selected for the circuitry. Advantageously, this process uses less nickel and therefore requires less processing of the nickel and less process time spent on processing the nickel.

In FIG. 3(I) further subsequent process steps strip unreacted nickel in a step 581, followed by PMD liner and PMD deposition in a step 586, followed by a step 591 contact opening, and interconnect formation.

Category IV: Dopant Multiplication Prior to Gate Stack Etch

In Category IV embodiments prior to etching to form gate stacks, silicidation into nickel monosilicide (NiSi) or nickel disilicide ($NiSi_2$) drives gate dopants into the barrier layer thereby advantageously multiplying dopant concentration relative to the poly precursor. The monosilicide or disilicide type depends on the relative initial thicknesses of nickel and poly layers.

The description for Category IV refers to structures in FIGS. 6A and 6B and to process steps of FIG. 7 process 700.

In FIG. 6A, Category IV layer stack deposition steps provide layers as follows: poly 124 on top of barrier layer 118 on top of gate dielectric 116. The poly 124 is doped to have areas of n-doping 126N and p-doping 126P for the NFETs and PFETs respectively.

In FIG. 6B, a step 733 deposits metal such as thick nickel 670 atop the poly 124 above both the areas of n-doping 126N and p-doping 126P. The top two layers (the nickel layer 670 over poly layer 124) have approximately a 1:1 or 1:2 ratio of nickel thickness to polysilicon thickness depending on whether NiSi or NiSi2 is desired for the resulting gates. Determine the acceptable gate resistance for the application and then derive the gate thickness of disilicide NiSi2 desired. From that gate thickness, derive from their metal properties the starting thicknesses of nickel and silicon layers prior to silicidation. For one example, deposit 500 A nickel thickness and approximately 1000 A polysilicon thickness. (To be very exact, compute the thicknesses that correspond to a stoichiometric ratio of nickel to silicon of 1:2 so that NiSi2 will preferentially form with the resulting gate thickness desired.) An example using disilicide NiSi2 is described further here.

In FIG. 6B, a silicidation anneal step 735 suicides the gate into nickel disilicide (NiSi2) by consuming the poly and driving the gate dopants into the barrier layer to tune its work function respective to the NFET and PFET to be ultimately fabricated. This anneal step 735 occurs at a temperature between approximately 800 C where the activation time becomes very long and approximately 1300 C (melting point of NiSi) where the activation time is less than a millisecond. An even more convenient range of temperatures for many process embodiments is 1000-1300 C with times of 5 seconds or less with anneal duration decreasing with temperature. A preferred temperature is about 1000 C and activation anneal duration about 5 seconds.

Gate patterning and etching of the now-formed silicide 680 is performed at a step 736 to reveal each N-FET gate and the P-FET gate. Process step 736 patterns and deeply etches through layers 680, 118 down to and not including the gate dielectric. The gate is overlain with photoresist or hardmask material to prevent etching of the gate from above. The nickel silicide is wet-etched down to the gate dielectric, with the gate dielectric acting as an etch stop. The etchant is a highly reactive etchant selected by the skilled worker from choices such as 1) a solution of hydrocholoric acid (HCl) and hydrogen peroxide ($H_2O_2$) in water ($H_2O$), 2) a solution called ammonium peroxide mix (AP), i.e. ammonium hydroxide ($NH_4OH$) and hydrogen peroxide in water, and 3) any other highly reactive etchant selective between the metal silicide and the gate dielectric. Considerations in using the wet etch are: A) the wet etch may etch the metal silicide and the barrier layer beneath it at different rates, and the etch solution and etching time and temperature are selected to avoid undercut displacement of the gate stack by excessive etching of the barrier layer beneath the metal silicide. B) The wet etch is isotropic and may etch the middle of the silicide to be narrower in width than the uppermost and lowermost parts of the silicide. Accordingly, the etch conditions are established to maintain physical integrity of the silicide above the barrier layer as well.

As a result of this etch, nickel silicide 680 and barrier layer 118 are thus patterned, etched, and formed as a gate stack above and on the gate dielectric 116 of the NMOS regions and of the PMOS regions.

In steps 741-761, offset spacer formation, LDD (lightly doped drain) implant, gate sidewall spacer formation and S/D implants are performed.

In step 741, deposit and etch to form both the P-FET and N-FET gate offset spacers. Perform NLDD (n-lightly-doped-drain) implant in step 746. Perform PLDD (n-lightly-doped-drain) implant. In step 751-761, deposit and etch to form both the P-FET and N-FET S/D spacers laterally of the P-FET/N-FET gate offset spacers. Perform N_S/D (n-type source/drain) implant. Perform P_S/D p-type source/drain) implant.

An activation anneal step 771 activates the dopants in the silicon beneath the gate dielectric. This step 771 occurs at a temperature between approximately 800 C where the activation time becomes very long and approximately 1300 C (melting point of NiSi) where the activation time is less than a millisecond. An even more convenient range of temperatures for many process embodiments is 1000-1300 C with times of 5 seconds or less with anneal duration decreasing with temperature. A preferred temperature is about 1000 C and activation anneal duration about 5 seconds.

In S/D siliciding step 776, deposit nickel on the S/D and gate, with the nickel being in the thickness range 20-100 A (twenty to one hundred Angstroms). 50 (fifty) Angstroms nickel is selected for this example. Accordingly, deposit about 50 Angstroms nickel onto the source/drains. Then silicide formation is performed by next siliciding the source/drains S/D in a temperature range 350-750 C (three hundred fifty to seven hundred fifty degrees Celsius), with a more convenient temperature range 400-500 C (four hundred to five hundred degrees) with preferred temperature 450 C (four hundred fifty degrees). Apply the temperature long enough to produce NiSi nickel monosilicide and not so long as to cause migration of nickel to the point where NiSi2 nickel disilicide forms.

Subsequent process step 781 strips un-reacted nickel, followed by step 786 PMD deposition, contact opening, and interconnect formation. Step 791 back end processing is performed and the process completes at END 796.

Further Embodiments

Siliciding is a preferred method of multiplying the dopant concentration next to the barrier layer due to its relative simplicity. Also within the scope of the work here are alternative barrier layer formation processes next described. Many of these descriptions provide alternative descriptive terminology, or generalizing characterizations, of processes described hereinabove as well.

A first alternative barrier layer process lays down the doping simultaneously with formation of material of the barrier layer. The deposition process for the barrier layer preferably avoids a high energy implantation process that would statistically impact the doping and integrity of the gate dielectric layer and the doping and integrity of the underlying channel or cause physical recoil in the barrier layer that can physically deteriorate the gate dielectric.

A second alternative barrier layer process provides the undoped barrier layer, and then deposits a doped precursor on top of the barrier layer. Next, selectively removal of precursor by a selective process that does not remove the doping thereby increases the dopant concentration next to the barrier to a substantially higher level. Then the second alternative process executes a diffusion step to diffuse the dopant that had its dopant concentration increased, into the barrier.

A third alternative barrier layer process provides the barrier layer, and then deposits a doped precursor on top of the barrier layer. Next, replace the precursor with a metal compound to thereby evict the dopant from the region previously occupied by the doped precursor and transfer and deliver the dopant into the barrier.

A fourth alternative barrier layer process provides the barrier layer, and then deposits a doped precursor on top of the barrier layer. Next, substitute a metal compound in place of the precursor wherein the dopant has a substantially lower solubility in the metal compound than in the material of the precursor to thereby deliver dopant from the precursor into the barrier material. The substitution suitably occurs chemically by physical introduction of metal on and into the precursor, accompanied by chemical reaction of the metal with the precursor to produce the metal compound.

A fifth alternative barrier layer process provides the barrier layer, and then deposits a doped precursor on top of the barrier layer. Next, substitute a metallic substance in place of the precursor wherein the dopant has a substantially lower solubility in the metal compound than in the material of the precursor to thereby deliver dopant from the precursor into the barrier material. The substitution suitably occurs physically by dissolving the precursor, physically replacing the precursor with the metal and diffusing a residue comprised of dopant from the precursor into the barrier.

Note that a barrier material such as titanium nitride (TiN) has a grainy structure defined by grain boundaries of grains therein, and the dopant diffuses at different rates into and through such barrier material wherein the diffusion is faster at and along the grain boundaries than it is through the grain bodies of the barrier material. On the other hand, implanting delivers dopant according to a different physical distribution of the dopant into and through the grain bodies relative to the grain boundaries.

A variant of this embodiment recognizes that diffusivity of dopant through barrier material such as TiN varies with barrier crystal structure and composition (at a particular silicide temperature). Accordingly in such process variant, the barrier material deposition process itself also advantageously optimizes or tunes an N-type dopant vs. P-type dopant pileup ratio at the interface of the barrier layer with gate dielectric.

A sixth alternative barrier layer process provides the barrier layer doped onto the gate dielectric layer. Dopant is delivered by an atomic layer deposition machine along with the barrier layer material in at least the first and second atomic layers of the barrier layer material.

A seventh process concurrently builds an n-FET and p-FET in a series of process steps, some of the process steps shared by both n-FET and p-FET and other process steps respective to the n-FET and p-FET individually. A stack of layers common to both the n-FET and p-FET are built by the process steps shared by both n-FET and p-FET. Process steps respective to the n-FET and p-FET individually provide the different doping of the layers pertaining to the n-FET and p-FET. Etching or otherwise sculpturing the common stack of layers into respective stacks for the n-FET and p-FET occurs by one or more process steps shared by both n-FET and p-FET. The respective stacks for n-FET and p-FET have corresponding layers having a same material composition, except for the doping. The material composition of corresponding layers is within plus or minus 20% (twenty percent) stoichiometric composition of each of the main elemental constituents, (doping not considered).

In the real devices some dopant will enter the gate dielectric and some barrier layer material will be mixed with the gate dielectric near at the interface. It is contemplated in a category of embodiments that both dopant and the barrier layer material overlie and penetrate the gate dielectric less than five (5) Angstroms and/or less than three (3) atomic layers down from the gate (barrier included) into the gate dielectric.

In a seventh alternative embodiment forming an upside down transistor, the gate with barrier layer on top is built first, followed by deposition of gate dielectric on top of the gate by atomic layer deposition, followed by deposition of S/D and channel of the p-FETs and N-FETs.

In an eighth embodiment, atop the gate dielectric, there lies a metallic barrier layer with dopant concentration per unit volume greater than 5E19/cm3 and/or dopant concentration per unit area greater than 1E14/cm2. Atop the metal barrier layer, lies a metallic material with dopant concentration per unit volume less than 1E19/cm3 and/or dopant concentration per unit area less than 1E13/cm2.

A ninth alternative embodiment comprises a layer of gate dielectric. Overlying the gate dielectric is at least two barrier layers. Each of the barrier layers has a metallic material (not necessarily the same metallic material in all the barrier layers). Atop the barrier layers, lies a gate layer of a metallic material exceeding ten (10) times the thickness of the barrier layers combined. The first barrier layer next to the gate dielectric has a dopant concentration per unit volume greater than 5E19/cm3 and/or dopant concentration per unit area greater than 1E14/cm2. The second barrier layer (next above the barrier layer next to the gate dielectric) has a dopant concentration outside (i.e., higher or lower than) the range plus or minus 30% (thirty percent) of the dopant concentration (either per unit volume or per unit area) of the first barrier layer.

For purposes of this description, "activation" is a process wherein dopants initially situated in silicon are integrated more uniformly into the silicon lattice so that the dopants are free to perform their function of donating electrons in the case of a donor dopant (e.g. arsenic As), and accepting electrons in the case of an acceptor dopant (e.g. boron B). Strictly speaking, dopant does not activate in a metal (e.g. TiN), but instead bonds with atoms in the metal (e.g. titanium Ti).

Work function is varied by the concentration of dipoles at the gate interface with the gate dielectric and the barrier material used. Accordingly, it is desirable for easily reaching required dopant concentration, but not required, that the dopant concentration in the barrier layer be relatively uniform from the top to the bottom of the barrier layer thickness.

Poly doped with boron (B) loses boron dopant by diffusion into gate oxide more readily than poly doped with arsenic (As). Gate oxide is suitably doped with nitrogen (N) not only to retard diffusion of boron into the gate oxide but also to increase the dielectric constant of the gate dielectric. However, some disparity between boron and arsenic behavior remains. Advantageously, a barrier layer material such as TiN has high solubility to both boron (B) and arsenic (As) relative to both silicide above, and gate dielectric beneath. Accordingly, a high concentration of dopant such as boron in the TiN barrier is advantageously far less likely to diffuse into the oxide, than in the case of poly. In this way the barrier acts as an effective dopant retention layer. As a result, the process provides a sufficient duration of anneal time for applying the anneal at the silicide temperature after the silicidation has completed but while the dopant is diffusing and equilibrating through the thickness of the barrier. The anneal time is far less critical relative to considerations of dopant diffusion into the gate dielectric.

Thickness range of the barrier layer is barrier-material dependent. In TiN, for instance, the thickness is bounded at the low end by the thickness of two molecular monolayers (about 10 (ten) Angstroms or 1 (one) nanometer) in order to establish a full, continuous, band structure typical of metal conduction. "Band" as pertaining to metal refers to energy band, or Fermi sea, of conduction electrons in metal as understood in the field of solid state physics. The thickness is bounded at the high end by a thickness at which the diffusion time needed to achieve an acceptable dopant concentration at the barrier bottom surface at the gate dielectric interface becomes too long a duration of the diffusion time to be very practical. In TiN this upper end of the thickness range is at approximately 100 Angstroms or 10 (ten) nanometers when the temperature at which the diffusion occurs is approximately 1050 C. activation anneal and $NiSi_2$ silicidation. The thickness utilized for the barrier is suitably established in the lower part (e.g. 10-30 Angstroms or 1 to 3 nanometers) of the thickness range when a lower temperature like 450 C silicidation of NiSi monosilicide is utilized.

Multiple Gate Field Effect Transistors

The advantageous processes and structures disclosed herein are applicable to fabrication of a variety of transistors. For example, multiple gate field effect transistors (MUGFETs) have one or more gates respectively including a doped barrier layer having dopant multiplied after consumption of a poly precursor by silicidation.

Figure 8:
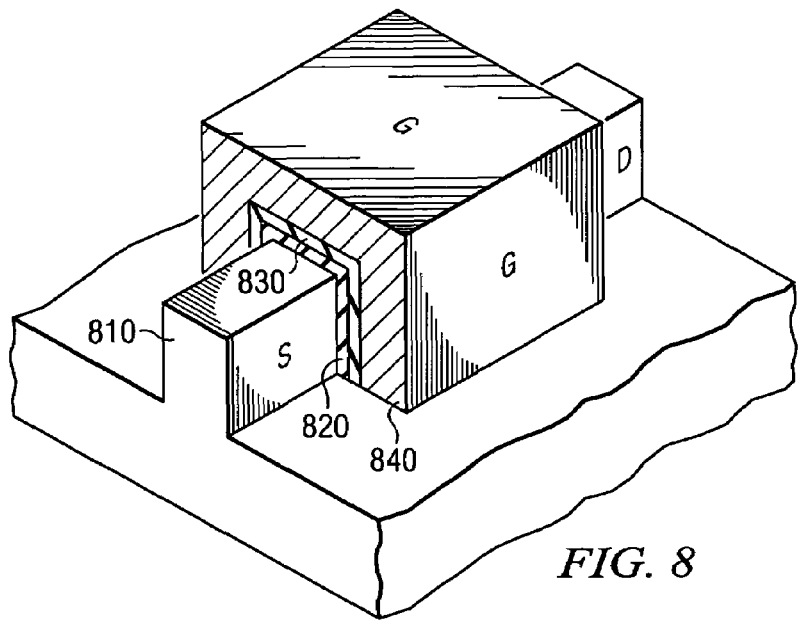
FIG. 8 is a pictorial diagram of a multiple gate field effect transistor improved with silicide-on-doped-barrier gates.

In FIG. 8, a type of multiple gate field effect transistor called a FINFET has a vertical fin-shaped channel 810 comprised of substrate which has been etched on either side to reveal that channel 810. Successive depositions establish gate dielectric 820 next to and on channel 810, and a barrier layer 830 next to and on gate dielectric 820. Doped poly 840 is surrounded by thick nickel, and silicidation anneal of the nickel and poly consumes the poly and drives and transfers dopant from the then-consumed poly into the barrier layer 830. Then the remaining nickel is stripped. Subsequent steps in FINFET construction complete the S/D and back end processing is provided as discussed earlier hereinabove.

Layout of Transistors of FIGS. 1G and 3(I)

Figure 9A:
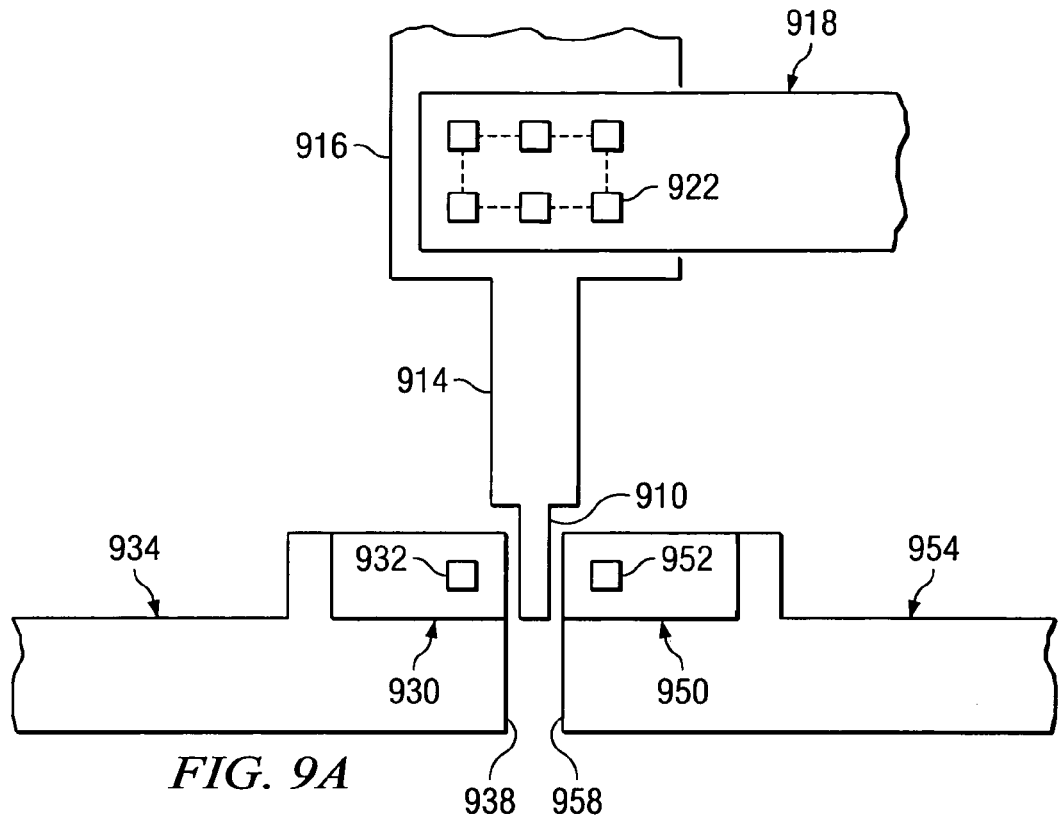
FIG. 9A is a layout diagram, or top view, showing an improved transistor of each of FIGS. 1G, and 3(I) seen broadside and perpendicular to the cross-sections herein.

In a layout, or top view, of FIG. 9A, the transistors of FIG. 1G and FIG. 3(I) are shown in a direction looking downward and broadside to a substrate. A gate finger 910 overlies a channel region separating a source 930 and a drain region 950. The gate has a narrow finger 910 joined by a wider interconnect segment 914 to a larger interconnect segment 916. A first Level 1 metal conductor 918 is connected to larger interconnect segment 916 by vias 922. (Metal conductors of the integrated circuit are formed in levels above the transistors designated Level 1, Level 2, and so on.) Further in FIG. 9A, source 930 is connected by via 932 to a second Level 1 metal conductor 934. Drain 950 is connected by via 952 to a third Level 1 metal conductor 954.

Figure 9B:
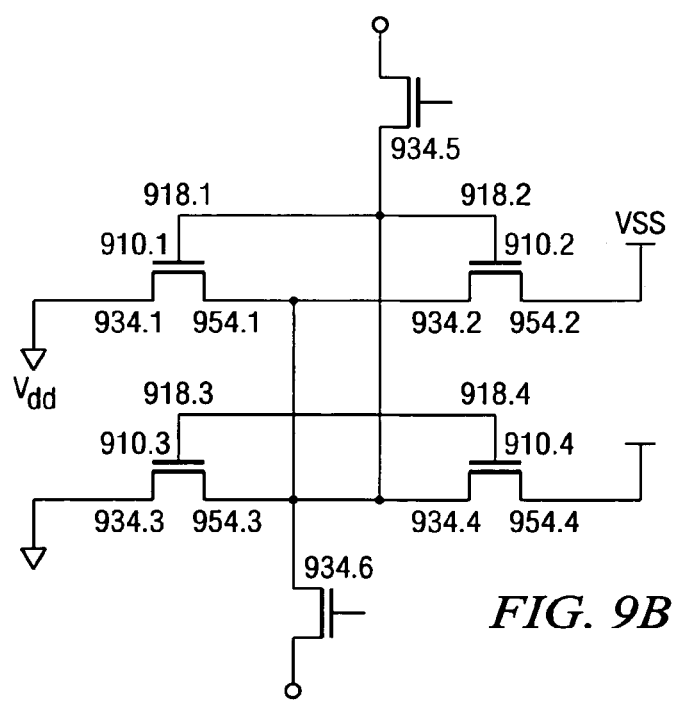
FIG. 9B is a schematic diagram of an improved integrated circuit diagrammatically related to the improved transistors of each of FIGS. 1G, 3(I) and 9A.

In the schematic diagram of FIG. 9B, which is correlated to FIG. 9A, any suitable number of additional transistors have conductors 918.i, 934.i, 954.i; where index i takes on different numbers to represent different transistors on the substrate. Each of the transistors is visually identical or similar in layout to the layout shown in FIG. 9.

In FIG. 9B, an SRAM cell or flip-flop includes two pairs of transistors are, for instance connected drain to source 954.1 to 934.2 and 954.3 to 934.4. A supply voltage conductor Vss is connected to both drains 954.2 and 954.4. A second supply voltage conductor Vdd is connected to both sources 934.1 and 934.3. The drain-to-source conductors 954.1, 934.2 as connected suitably extend as conductors 918.3 and 918.4 to couple to the gates 910.3, 910.4 as well as a source 934.5 of a pass transistor. The drain-to-source conductors 954.3, 934.4 as connected suitably extend as conductors 918.1 and 918.2 to couple to gates 910.1, 910.2 as well as a source 934.6 of another pass transistor. The transistors are also advantageously and conveniently connected to form pass gates, and NAND, NOR, XNOR and other logic gates, and such other transistor circuits and assemblies as the needs of an application call for.

Improved Integrated Circuits and Systems

Figure 10:
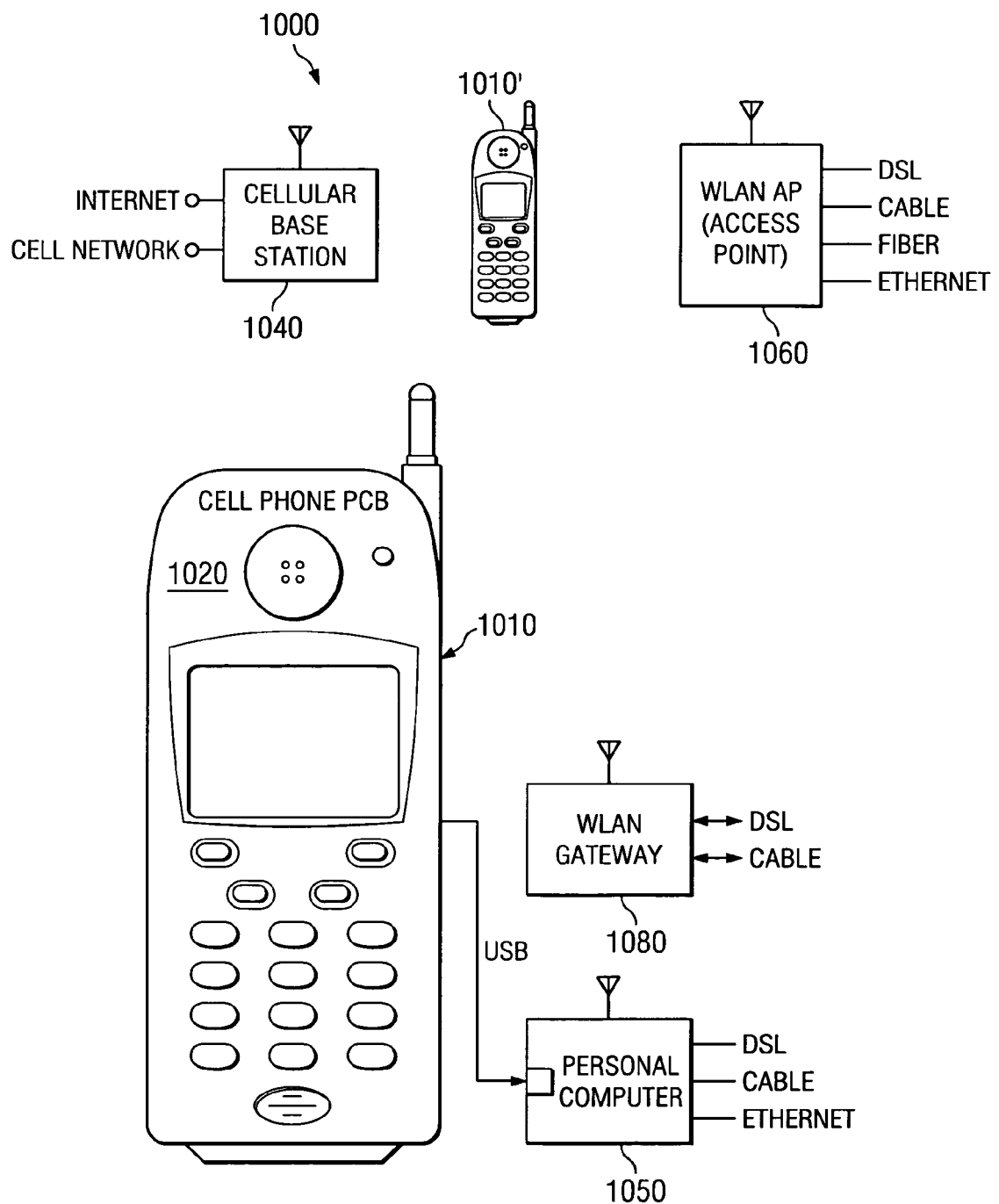
FIG. 10 is a pictorial diagram of an inventive telecommunications system including inventive wireless handset and inventive integrated circuits of FIG. 11.

In FIG. 10, a cell phone has augmented features, due to the advantages conferred by the processes. An improved communications system 1000 has system blocks with selectively-determinable security level. Any or all of the system blocks, such as cellular telephone and data handsets 1010 and 1010', a cellular (telephony and data) base station 1040, a WLAN AP (wireless local area network access point with IEEE 802.11 or otherwise) 1060, a WLAN gateway 1080, and a personal computer (PC) 1090, communicate with each other in communications system 1000. Each of the system blocks 1010, 1010', 1040, 1060, 1080, 1090 are provided with one or more PHY physical layer blocks and interfaces as selected by the skilled worker in various products, for DSL (digital subscriber line broadband over twisted pair copper infrastructure), cable (DOCSIS and other forms of coaxial cable broadband communications), fiber (fiber optic cable to premises), and Ethernet wideband network. Cellular base station 1040 two-way communicates with the handsets 1010, 1010', with the Internet, with cellular communications networks and with PSTN (public switched telephone network).

In this way advanced networking capability for services and content, such as cellular telephony and data, audio, music, voice, video, e-mail, e-commerce, file transfer and other data services, internet, world wide web browsing, TCP/IP (transmission control protocol/Internet protocol), voice over packet and voice over Internet protocol (VoP/VoIP), and other services accommodates and provides security for secure utilization and enjoyment appropriate to the just-listed and other particular applications, while recognizing market demand for different levels of security. The embodiments, applications and system blocks disclosed herein are suitably implemented are suitably implemented in fixed, portable, mobile, automotive, seaborne, and airborne, communications, control, and other apparatus.

For example, handset 1010 is improved for selectively determinable security when manufactured. Handset 1010 remains interoperable and able to communicate with all other similarly improved and unimproved system blocks of communications system 1000. On a cell phone printed circuit board (PCB) 1020 in handset 1010, there is provided a processor integrated circuit 1022, an external flash memory 1024, and a serial interface 1026. Serial interface 1026 is suitably a wireline interface, such as a USB interface connected by a USB line to the personal computer 1090 when the user desires and for reception of software intercommunication and updating of information between the personal computer 1090 (or other originating sources external to the handset 1010) and the handset 1010. Such intercommunication and updating also occur via WLAN, Bluetooth, or other wireless circuitry 1028.

Figure 11:
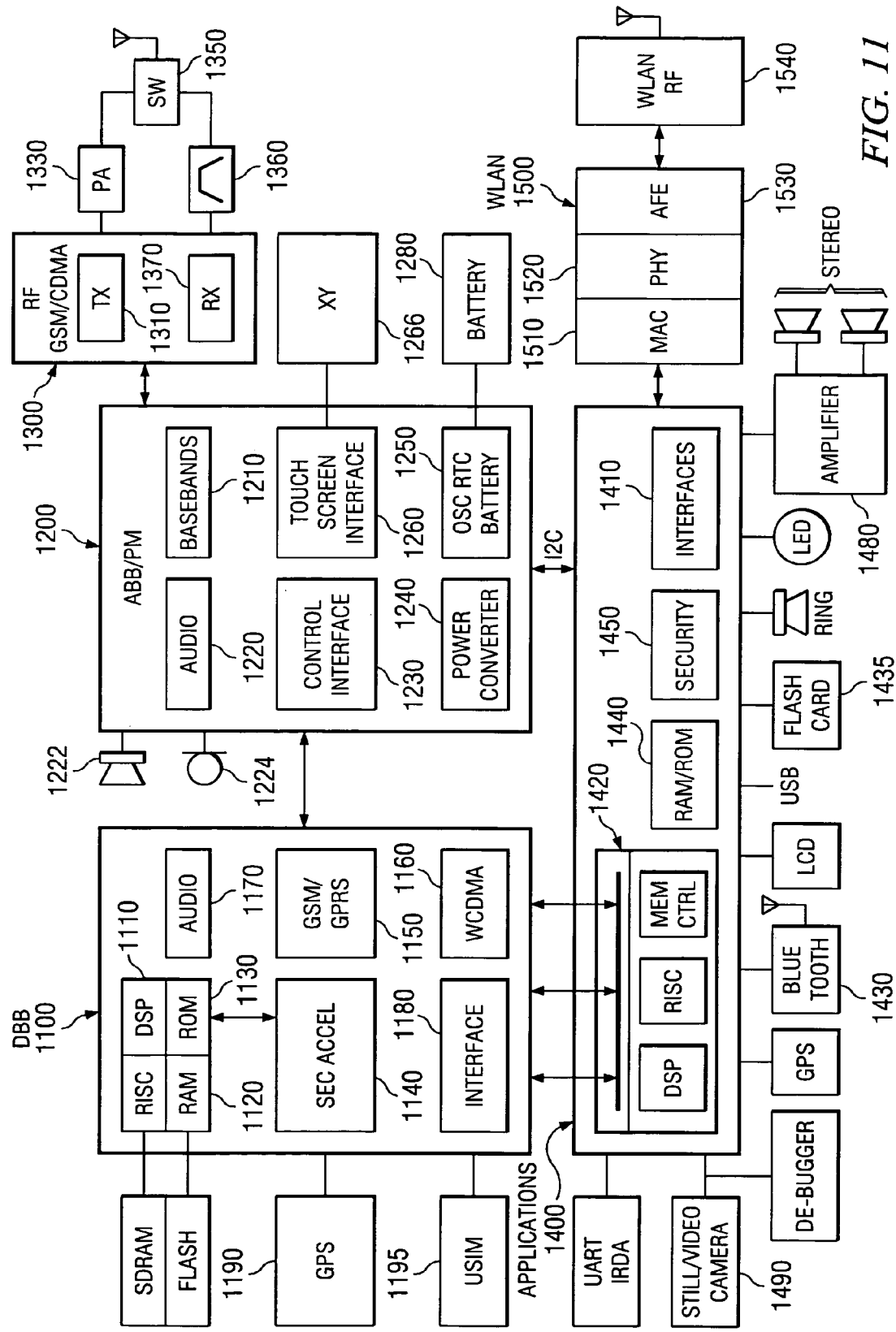
FIG. 11 is a block diagram of an inventive wireless handset including inventive integrated circuits made by any of the improved processes and including the improved transistors illustrated in the other Figures.

FIG. 11 illustrates inventive integrated circuit chips for use in the blocks of the communications system 1000 of FIG. 10. The skilled worker uses and adapts the integrated circuits to the particular parts of the communications system 1000 as appropriate to the functions intended. For conciseness of description, the integrated circuits are described with particular reference to use of all of them in the cellular telephone handsets 1010 and 1010' by way of example.

It is contemplated that the skilled worker uses each of the integrated circuits shown, or such selection from the complement of blocks therein provided into appropriate other integrated circuit chips, in a manner optimally combined or partitioned between the chips, to the extent needed by any of the applications supported by the cellular telephone base station 1040, personal computer(s) 1090 equipped with WLAN, WLAN access point 1060 and WLAN gateway 1080, as well as radios and televisions, fixed and portable entertainment units, routers, pagers, personal digital assistants (PDA), organizers, scanners, faxes, copiers, household appliances, office appliances, combinations thereof, and other application products now known or hereafter devised in which there is desired increased, partitioned or selectively determinable advantages next described: More applications performance, less power drain on batteries, longer battery life, lower integrated circuit cost of manufacture, lower milliwatts of power dissipation per gigahertz (mW/GHz), higher GOPS per unit area of the integrated circuit (GOPS/cm2), reduced leakage current per transistor, reduced gate resistance, faster memory access.

In FIG. 11, an integrated circuit 1100 made by any one or more of the processes described herein includes a digital baseband (DBB) block 1110 that has a RISC processor (such as MIPS core, ARM processor, or other suitable processor), a digital signal processor (DSP), security accelerators 1140, and a memory controller. The memory controller interfaces the RISC and the DSP to off-chip Flash memory and SDRAM (synchronous dynamic random access memory). The memories are improved by any one or more of the processes herein. On chip RAM 1120 and on-chip ROM 1130 also are accessible to the processors via the memory controller. Digital circuitry 1150 on integrated circuit 1100 supports and provides interfaces for one or more of GSM, GPRS, EDGE, and UMTS (Global System for Mobile communications, General Packet Radio Service, Enhanced Data Rates for Global Evolution, Universal Mobile Telecommunications System) wireless, with or without high speed digital data service, via the analog baseband chip 1200 and GSM chip 1300. Digital circuitry 1150 includes ciphering processor CRYPT for GSM ciphering and/or other encryption/decryption purposes. Blocks TPU (Time Processing Unit real-time sequencer), TSP (Time Serial Port), GEA (GPRS Encryption Algorithm block for ciphering at LLC logical link layer), RIF (Radio Interface), and SPI (Serial Port Interface) are included in digital circuitry 1150.

Digital circuitry 1160 provides codec for CDMA (Code Division Multiple Access), CDMA2000, and/or WCDMA (wideband CDMA) wireless with or without an HSDPA (High Speed Downlink Packet Access) (or 1xEV-DV, 1xEV-DO or 3xEV-DV) data feature via the analog baseband chip 1200 and the CDMA chip 1300. Digital circuitry 1160 includes blocks MRC (maximal ratio combiner for multipath symbol combining), ENC (encryption/decryption), RX (downlink receive channel decoding, de-interleaving, viterbi decoding and turbo decoding) and TX (uplink transmit convolutional encoding, turbo encoding, interleaving and channelizing.). Block ENC has blocks for uplink and downlink supporting confidentiality processes of WCDMA.

Audio/voice block 1170 supports audio and voice functions and interfacing. Applications interface block 1180 couples the digital baseband 1100 to the applications processor 1400. Serial interface 1180 interfaces from parallel on-chip digital busses to USB (Universal Serial Bus) of a PC (personal computer). Serial interface 1180 includes UARTs (universal asynchronous receiver/transmitter circuit) for performing the conversion of data between parallel and serial lines. Chip 1100 is coupled to location-determining circuitry 1190 for GPS (Global Positioning System), and to a USIM (UMTS Subscriber Identity Module) 1195 or other SIM.

In each block, improvements are provided in any one or more of higher speed, wider busses, additional memory, more applications programs, more concurrency of application execution, more simultaneous processing operations, lower power dissipation, and smaller size. In this way, advances in wireless service, higher quality of service (QoS) and in the user experience of applications, are provided by the improved processes described herein and integrated circuits made by these processes.

In FIG. 11 a mixed-signal integrated circuit 1200 includes an analog baseband (ABB) block 1210 for GSM/GPRS/EDGE/UMTS which includes SPI (Serial Port Interface), digital-to-analog/analog-to-digital conversion DAC/ADC block, and RF (radio frequency) Control pertaining to GSM/GPRS/EDGE/UMTS and coupled to RF (GSM etc.) chip 1300. Block 1210 suitably includes an analogous ABB for WCDMA wireless and any associated HSDPA data (or 1xEV-DV, 1EV-DO or 3xEV-DV data and/or voice) with its respective SPI (Serial Port Interface), digital-to-analog conversion DAC/ADC block, and RF Control pertaining to WCDMA and coupled to RF (WCDMA) chip 500. An audio block 1220 has audio I/O (input/output) circuits to a speaker 1222, a microphone 1224, and headphones (not shown). Audio block 1220 includes a voice codec and a stereo DAC (digital to analog converter), which in turn have the signal path coupled to the basebands block 1210 with suitable encryption/decryption activated or not.

A control interface 1230 has a primary host interface (I/F) and a secondary host interface to DBB-related integrated circuit 1100 of FIG. 2A for the respective GSM and WCDMA paths. The integrated circuit 1200 is also interfaced to the 12C port of applications processor chip 1400 of FIG. 2E. Control interface 1230 is also coupled via access arbitration circuitry to the interfaces in circuits 1250 and the basebands 1210. A power conversion block 1240 includes buck voltage conversion circuitry for DC-to-DC conversion, and low-dropout (LDO) voltage regulators for power management/sleep mode of respective parts of the chip regulated by the LDOs. Power conversion block 1240 provides information to and is responsive to a power control state machine shown between the power conversion block 1240 and circuits 1250.

Circuits 1250 provide a 32 KHz oscillator and 12 MHz oscillator for clocking chip 1200. The oscillators have frequencies determined by respective crystals (omitted for brevity). Circuits 1250 include a RTC real time clock (time/date functions), general purpose I/O, a vibrator drive (supplement to cell phone ringing features), a USB On-The-Go (OTG) transceiver, and touch screen interface 1260. A touch screen 1266 off-chip is connected to the touch screen interface 1260 on-chip. Batteries such as a lithium-ion battery 1280 and backup battery provide power to the system and battery data on suitably provided separate lines from the battery pack. When needed, the battery also receives charging current from the Battery Charge Controller in analog circuit 1250 which includes MADC (Monitoring ADC and analog input multiplexer such as for on-chip charging voltage and current, and battery voltage lines, and off-chip battery voltage, current, temperature) under control of the power control state machine.

Further in FIG. 11 an RF integrated circuit 1300 includes a GSM/GPRS/EDGE/UMTS RF transmitter block 1310 including oscillator circuitry with off-chip crystal (not shown). Transmitter block 1310 is fed by baseband block 1210 of FIG. 2B. Transmitter block 1310 drives an off-chip dual band RF power amplifier (PA) 1330. On-chip voltage regulators maintain appropriate voltage under conditions of varying power usage. Off-chip switchplexer 1350 couples wireless antenna and switch circuitry in FIG. 2D to both the transmit portion 1310, 1330 in FIG. 2C and the receive portion next described. Switchplexer 1350 is coupled via bandpass filters 1360 to receiver 1370. Receiver 1370 includes LNAs (low noise amplifiers) for 850/900 MHz, 1800 MHz, and 1900 MHz. Depending on the band in use, the output of the LNAs couples to a GSM/GPRS/EDGE/UMTS demodulator in receiver 1370 to produce the I/Q outputs thereof (in-phase, quadrature) to the GSM/GPRS/EDGE/UMTS baseband block 1210 in integrated circuit 1200.

An integrated circuit chip 1400 is provided for further application processing and various off-chip peripherals. On-chip are found a high-speed WLAN 802.11a/b/g interface circuit 1410 coupled to a WLAN chip 1500. Further provided on chip 1400 is an applications processing section 1420 which includes a RISC processor (such as MIPS core, ARM processor, or other suitable processor), a digital signal processor (DSP), and a shared memory controller MEMCTRL with DMA (direct memory access), and a 2D (two-dimensional display) graphic accelerator. The RISC and the DSP have access via on-chip extended memory interface (EMIF/CF) to off-chip memory resources 1435 including as appropriate, mobile DDR (double data rate) DRAM, and flash memory of any of NAND Flash, NOR Flash, and Compact Flash. On-chip, the shared memory controller in circuitry 1420 interfaces the RISC and the DSP via on-chip bus to on-chip memory 1440 with RAM and ROM. The 2D graphic accelerator is coupled to frame buffer internal SRAM (static random access memory) in memory area 1440. A security block 1450 includes secure hardware accelerators having security features and provided for accelerating encryption and decryption of any one or more types known in the art.

On-chip peripherals interfaces block 1410 further includes UART data interface and MCSI (Multi-Channel Serial Interface) voice interface for off-chip Bluetooth short distance wireless circuit 1430. Debug messaging and serial interfacing are also available through the UART. A JTAG emulation interface couples to an off-chip emulator for test and debug. Further in peripherals interfaces 1410 are an I2C interface to analog baseband ABB chip 1200, and an interface 1485 to applications interface 1180 of integrated circuit chip 1100 having digital baseband DBB. Interface 1485 includes a MCSI voice interface, a UART interface for controls, and a multi-channel buffered serial port (McBSP) for data. Timers, interrupt controller, and RTC (real time clock) circuitry are provided in chip 1400. Further in peripherals interfaces 1410 are a MicroWire (u-wire 4 channel serial port) and multi-channel buffered serial port (McBSP) to off-chip Audio codec, a touch-screeen controller, and audio amplifier 1480 to stereo speakers. External audio content and touch screen (in/out) are suitably provided. Additionally, an on-chip USB OTG interface couples to off-chip Host and Client devices. These USB communications are suitably directed outside handset 1010 such as to PC 1090 (personal computer) and/or from PC 1090 to update the handset 110.

An on-chip UART/IrDA (infrared data) interface 1410 couples to off-chip GPS (global positioning system) and Fast IrDA infrared communications device. An interface provides EMT9 and Camera interfacing to one or more off-chip still cameras or video cameras 1490, and/or to a CMOS sensor of radiant energy, and/or to a debugger. Further in FIG. 11, interfaces 1410 include an on-chip LCD controller and associated PWL (Pulse-Width Light) block that are coupled to a color LCD display and its LCD light controller off-chip. Further, on-chip interfaces 1410 are respectively provided for off-chip keypad and GPIO general purpose input/output, on-chip LPG (LED Pulse Generator) and PWT (Pulse-Width Tone) interfaces are respectively provided for off-chip LED and buzzer peripherals 1470. On-chip MMC/SD multimedia and flash interfaces are provided for off-chip MMC Flash card, SD flash card and SDIO peripherals 1480. An on-chip selectable-mode HDQ or 1-Wire (hardware protocols) battery monitoring serial interface module is provided for monitoring the off-chip Battery. On-chip Clock and Reset management circuitry is connected to off-chip 12 MHz and 32 KHz crystals and to a reset pushbutton switch (not shown).

In FIG. 11, a WLAN integrated circuit 1500 includes MAC (media access controller) 1510, PHY (physical layer) 1520 and AFE (analog front end) 1530. PHY 1520 includes blocks for BARKER coding, CCK, and OFDM. PHY 1520 receives PHY Clocks from a clock generation block supplied with suitable off-chip host clock, such as at 13, 16.8, 19.2, 26, or 38.4 MHz. These clocks are often found in cell phone systems and the host application is suitably a cell phone or any other end-application. AFE 1530 is coupled by receive (Rx), transmit (Tx) and CONTROL lines to an off-chip WLAN RF circuitry 1540. WLAN RF 1540 includes a 2.4 GHz (and/or 5 GHz) direct conversion transceiver and power amplifier and has low noise amplifier LNA in the receive path. Bandpass filtering couples WLAN RF 1540 to a WLAN antenna. In MAC 1510, Security circuitry supports any one or more of various encryption/decryption processes such as WEP (Wired Equivalent Privacy), RC4, TKIP, CKIP, WPA, AES (advanced encryption standard), 802.11i and others. Further in FIG. 11, a processor in MAC 1510 is has an embedded CPU (central processing unit) connected to internal RAM and ROM and coupled to provide QoS (Quality of Service) IEEE 802.11e operations WME, WSM, and PCF (packet control function). A security block in MAC 1510 has busing for data in, data out, and controls interconnected with the CPU. Interface hardware and internal RAM on-chip couples that CPU with interface 1410 of applications processor integrated circuit 1400.

A few preferred embodiments have been described in detail hereinabove. It is to be understood that the scope of the invention comprehends embodiments different from those described yet within the inventive scope. Microprocessor and microcomputer are synonymous herein. Processing circuitry comprehends digital, analog and mixed signal (digital/analog) integrated circuits, ASIC circuits, PALs, PLAs, decoders, memories, non-software based processors, and other circuitry, and digital computers including microprocessors and microcomputers of any architecture, or combinations thereof. Internal and external couplings and connections can be ohmic, capacitive, direct or indirect via intervening circuits or otherwise as desirable. Implementation is contemplated in discrete components or fully integrated circuits in any materials family and combinations thereof. Various embodiments of the invention employ hardware, software or firmware. Process diagrams herein are representative of flow diagrams for operations of any embodiments whether of hardware, software, or firmware, and processes of manufacture thereof.

While this invention has been described with reference to illustrative embodiments, this description is not to be construed in a limiting sense. Various modifications and combinations of the illustrative embodiments, as well as other embodiments of the invention may be made. The terms "including", "includes", "having", "has", "with", or variants thereof are used in either the detailed description and the claims to denote non-exhaustive inclusion in a manner similar to the term "comprising". It is therefore contemplated that the appended claims and their equivalents cover any such embodiments, modifications, and embodiments as fall within the true scope of the invention.

Invention Aspects for Additional Claims in Prosecution and in Continuing Application(s) such as Upon Restriction Below, sets of numbered inventive aspects are listed with enumeration based on assumption of adding the aspects as dependent claims at an appropriate point in prosecution of this application or in a divisional/continuation depending on whether a restriction requirement arises in prosecution.

Aspects next below represent inventive aspects such as for introduction as dependent claims 21-42 into the set of claims relative to claim 20.

The process of claim 20 wherein the subsequent siliciding produces silicide in the gate, that has a metal silicide composition with substantially the same elements as the silicide of the source/drains.

The process of claim 20 further wherein the subsequently siliciding produces a gate with substantially the same silicide composition as the source/drains.

The process of claim 20 further wherein the subsequently siliciding produces a gate with a silicide composition having substantially the same elements but a different chemical ratio compared to the silicide of the source/drains.

The process of claim 20 further comprising physically isolating the source/drain areas and then depositing the additional metallic material on the gate prior to the subsequently siliciding.

The process of claim 20 wherein the subsequently siliciding consumes the silicon-based precursor and thereby drives dopant from the doped silicon-based precursor into the first metallic material.

The process of claim 20 wherein the partially siliciding is performed at a first temperature and the siliciding of the gate totally is performed at a second temperature higher than the first temperature.

The process of claim 20 further comprising performing an activation anneal on at least the substrate prior to the partially siliciding.

The process of claim 27 wherein the activation anneal is performed at a first temperature and the partially siliciding is performed at a second temperature lower than the first temperature.

The process of claim 27 wherein the activation anneal is performed at a first temperature and the siliciding of the gate totally is performed at a second temperature lower than the first temperature.

The process of claim 27 wherein the activation anneal is performed at a first temperature, and the partial siliciding is performed at a second temperature lower than the first temperature, and the siliciding of the gate totally is performed at a third temperature lower than the first temperature and at least as high as the second temperature.

The process of claim 27 further comprising performing an activation anneal on at least the substrate prior to the partially siliciding, and wherein the activation anneal is performed at a third temperature higher than both the first temperature of partially siliciding and the second temperature of siliciding the gate totally.

The process of claim 20 wherein the additional metallic material is a thicker layer than the second metallic material.

The process of claim 20 wherein the subsequently siliciding totally occurs at a temperature that also further distributes silicide in the source/drain areas that was provided from the partially siliciding only.

The process of claim 20 wherein the substrate has a channel and the process further comprises non-uniformly doping the channel.

The process of claim 20 for making integrated circuits having long-channel transistors and short-channel transistors wherein the substrate has a channel and the process further comprising using a pocket dose implant that is established in the channel beneath and around the gate to create non-uniform doping in the channel for short channel transistor, and Vt adjust implant for substantially uniform channel doping concentration across the gate length for long channel transistor.

The process of claim 20 further comprising establishing an initial doped well in the substrate prior to the partial siliciding, and forming source/drains thereby defining a channel therebetween, the channel retaining the doping characteristics of the initial doped well throughout the process substantially unchanged.

The process of claim 20 wherein the first metallic material is selected from the group consisting of metal nitride, metal carbide, or metal boride.

The process of claim 37 wherein the first metallic material is selected from the group consisting of titanium nitride and tantalum nitride.

The process of claim 20 wherein the second metallic material is selected from the group consisting of nickel (Ni), cobalt (Co), platinum (Pt), tantalum (Ta), or any alloy of at least two of the foregoing.

The process of claim 20 wherein the additional metallic material is selected from the group consisting of nickel (Ni), cobalt (Co), platinum (Pt), tantalum (Ta), or any alloy of at least two of the foregoing.

The process of claim 20 wherein the first metallic material is selected from the group consisting of metal nitride, metal carbide, or metal boride and the second metallic material is selected from the group consisting of nickel (Ni), cobalt (Co), platinum (Pt), tantalum (Ta), or any alloy of at least two of the foregoing; and the additional metallic material is selected from the group consisting of nickel (Ni), cobalt (Co), platinum (Pt), tantalum (Ta), or any alloy of at least two of the foregoing.

The process of claim 20 wherein the resulting gate silicide is substantially composed of a nickel silicide, and the first metallic material is substantially composed of titanium nitride.

Aspects next below represent inventive aspects such as for introduction as dependent claims 44-57 into the set of claims relative to original claim 21, and with claim 21 renumbered to be claim 43.

The process of claim 43 further comprising forming offset spacers for NFET and PFET concurrently and forming sidewall spacers for NFET and PFET concurrently.

The process of claim 43 further comprising etching gate stacks with the silicon-based precursor atop the barrier layer on the gate dielectric, for NFET and PFET concurrently, prior to siliciding totally.

The process of claim 43 further comprising forming and siliciding source/drains for NFET and PFET concurrently prior to siliciding the silicon-based precursor totally.

The process of claim 46 wherein the siliciding produces silicide in the gate, that has a metal silicide composition with substantially the same elements as the silicide of the source/drains.

The process of claim 46 wherein the siliciding produces silicide in the gate that has a metal suicide composition with substantially the same elements but in a different chemical ratio compared to the metal silicide of the source/drains.

The process of claim 46 wherein the siliciding produces silicide in the gate that has a metal silicide composition with substantially the same elements and in substantially the same chemical ratio as the metal silicide of the source/drains.

The process of claim 43 with a substrate having a channel beneath the gate dielectric, the process further comprising non-uniformly doping the channel.

The process of claim 43 for making integrated circuits having long-channel transistors and short-channel transistors on a substrate with a channel, the process further comprising using a pocket dose implant that is established in the channel beneath and around the gate to create non-uniform doping in the channel for short channel transistor, and Vt adjust implant for substantially uniform channel doping concentration across the gate length for long channel transistor.

The process of claim 43 wherein the gate dielectric is formed on a substrate, the process further comprising establishing an initial doped well in the substrate prior to the driving step, and forming source/drains thereby defining a channel therebetween, the channel retaining the doping characteristics of the initial doped well throughout the process substantially unchanged.

The process of claim 43 wherein the barrier layer has material is selected from the group consisting of metal nitride, metal carbide, or metal boride.

The process of claim 43 wherein the barrier layer includes metallic material selected from the group consisting of titanium nitride and tantalum nitride.

The process of claim 43 wherein the siliciding utilizes a metallic material selected from the group consisting of nickel (Ni), cobalt (Co), platinum (Pt), tantalum (Ta), or any alloy of at least two of the foregoing.

The process of claim 43 wherein the barrier layer includes metallic material selected from the group consisting of metal nitride, metal carbide, or metal boride and the siliciding utilizes metallic material selected from the group consisting of nickel (Ni), cobalt (Co), platinum (Pt), tantalum (Ta), or any alloy of at least two of the foregoing.

The process of claim 43 wherein the siliciding produces a material substantially composed of a nickel silicide, and the barrier layer is substantially composed of titanium nitride.

Aspects next below represent inventive aspects such as for introduction as dependent claims 59-71 into the set of claims relative to claim 22, and with claim 22 renumbered to be claim 58.

The integrated circuit of claim 58 wherein the metallic barrier material is less than one-tenth the thickness of the metal silicide.

The integrated circuit of claim 58 wherein the thickness of the metallic barrier material, relative to the thickness of the gate dielectric, is greater than half and less than twice the thickness of the gate dielectric.

The integrated circuit of claim 58 further comprising a substrate with silicided source drains, the gate dielectric on the substrate, wherein said metal silicide has a composition with substantially the same elements as the silicide of the source/drains.

The integrated circuit of claim 58 further comprising a substrate with silicided source drains, the gate dielectric on the substrate, wherein the source/drains have a metal silicide composition, and the metal silicide on the barrier has a metal silicide composition substantially the same as the metal silicide composition of the source/drains.

The integrated circuit of claim 58 further comprising a substrate with silicided source drains, the gate dielectric on the substrate, wherein the source/drains have a metal silicide composition, and the metal silicide on the barrier has a metal silicide composition substantially having the same elements but in a different chemical ratio compared to the metal silicide composition of the source/drains.

The integrated circuit of claim 58 wherein the doped metallic barrier material has a dopant concentration in the range 1E20/cm3 and about 1E22/cm3.

The integrated circuit of claim 58 wherein the metal silicide has a dopant concentration level less than one-tenth the concentration of dopant in the metallic barrier layer.

The integrated circuit of claim 58 wherein the metallic barrier layer thus doped has a work function in the range of 4.1 eV plus or minus 0.2 eV for an NFET.

The integrated circuit of claim 58 wherein metallic barrier layer thus doped has a work function in the range of 5.2 eV plus or minus 0.2 eV for a PFET.

The integrated circuit of claim 58 having a substrate with a channel beneath the gate dielectric, and the integrated circuit further comprising non-uniform doping in the channel for short channel transistor.

The integrated circuit of claim 58 having a substrate with a channel beneath the gate dielectric, and the integrated circuit further comprising substantially uniform channel doping concentration across the gate length for long channel transistor.

The integrated circuit of claim 58 further comprising a silicon-on-insulator substrate with a channel beneath the gate dielectric, the substrate further comprising an initial doped well with the channel retaining the doping characteristics of the initial doped well.

The integrated circuit of claim 58 further comprising a substrate having a fin, the gate dielectric provided on said fin.

Aspects next below represent inventive aspects such as for introduction as dependent claims 73-92 into the set of claims relative to claim 23, and with claim 23 renumbered to be claim 72.

The integrated circuit of claim 72 wherein the metallic barrier material is less than one-tenth the thickness of the metal silicide.

The integrated circuit of claim 72 wherein the thickness of the metallic barrier material, relative to the thickness of the gate dielectric, is greater than half and less than twice the thickness of the gate dielectric.

The integrated circuit of claim 72 further comprising a substrate with silicided source drains, the gate dielectric on the substrate, wherein the metal silicide has a composition with substantially the same elements as the silicide of the source/drains.

The integrated circuit of claim 72 further comprising a substrate with silicided source drains, the gate dielectric on the substrate, wherein the source/drains have a metal silicide composition, and the metal silicide on the barrier has a metal silicide composition substantially the same as the metal silicide composition of the source/drains for NFET and PFET.

The integrated circuit of claim 72 further comprising a substrate with silicided source drains, the gate dielectric on the substrate, wherein the source/drains have a metal silicide composition, and the metal silicide on the barrier has a metal silicide composition substantially having the same elements but in a different chemical ratio compared to the metal silicide composition of the source/drains for NFET and PFET.

The integrated circuit of claim 72 wherein the metallic barrier material has a dopant concentration in the range 1E20/cm3 and about 1E22/cm3 for both NFET and PFET, and is n-doped for NFET and p-doped for PFET.

The integrated circuit of claim 72 wherein the metal silicide has a dopant concentration level less than one-tenth the concentration of dopant in the metallic barrier layer.

The integrated circuit of claim 72 wherein the metallic barrier layer, thus doped has a work function in the range of 4.1 eV plus or minus 0.2 eV for the NFET and a work function 5.2 eV plus or minus 0.2 eV for the PFET.

The integrated circuit of claim 72 wherein metallic barrier layer thus doped has a work function difference of 1.0 eV plus or minus 0.2 eV between NFET and PFET.

The integrated circuit of claim 72 further comprising a substrate with a channel and non-uniform doping in the channel.

The integrated circuit of claim 72 having a substrate with a channel beneath the gate dielectric, and the integrated circuit further comprising non-uniform doping in the channel for short channel transistor.

The integrated circuit of claim 72 having a substrate with a channel beneath the gate dielectric, and the integrated circuit further comprising substantially uniform channel doping concentration across the gate length for long channel transistor.

The integrated circuit of claim 84 further comprising an additional transistor with non-uniform doping in the channel for short channel transistor.

The integrated circuit of claim 72 further comprising a silicon-on-insulator substrate with a channel beneath the gate dielectric, the substrate having an initial doped well with the channel retaining the doping characteristics of the initial doped well.

The integrated circuit of claim 72 further comprising a substrate having a fin, the gate dielectric provided on said fin.

The integrated circuit of claim 72 wherein the metallic barrier material is selected from the group consisting of metal nitride, metal carbide, or metal boride.

The integrated circuit of claim 72 wherein the metallic barrier material is selected from the group consisting of titanium nitride and tantalum nitride.

The integrated circuit of claim 72 wherein the metal of the metal silicide is selected from the group consisting of nickel (Ni), cobalt (Co), platinum (Pt), tantalum (Ta), or any alloy of at least two of the foregoing.

The integrated circuit of claim 72 wherein the metallic barrier material is selected from the group consisting of metal nitride, metal carbide, or metal boride and the metal of the metal silicide is selected from the group consisting of nickel (Ni), cobalt (Co), platinum (Pt), tantalum (Ta), or any alloy of at least two of the foregoing.

The integrated circuit of claim 72 wherein the metal silicide is substantially composed of a nickel silicide, and the metallic barrier material is substantially composed of titanium nitride.

Claim 24 would be renumbered 93 upon introduction into the claim set of all the aspect paragraphs as above.

What is claimed is:

1. A process for making an integrated circuit comprising a PMOS transistor with a gate and an NMOS transistor with a gate, the process comprising:
   forming a gate dielectric relative to a semiconductor region;
   forming a first metal layer adjacent the gate dielectric, wherein
   the first metal layer has a first work function;
   forming a precursor layer comprising silicon adjacent the first metal layer;
   doping the precursor layer with a first dopant in a first area corresponding to the NMOS transistor;
   doping the precursor layer with a second dopant, different than the first dopant, in a second area corresponding to the PMOS transistor;

forming a second metal layer in a fixed position relative to the doped precursor layer; and after the doping steps, forming a silicide by siliciding the second metal layer with the doped precursor layer to totally consume the doped precursor layer and drive dopants from the doped precursor layer into and to be retained in the first metal layer;

wherein in response to the siliciding step:
- the first metal layer comprises a substantial barrier to the silicide while accepting in a first portion of the first metal layer the first dopant and accepting in a second portion of the first metal layer the second dopant;
- the first portion develops a second work function, differing from the first work function; and
- the second portion develops a third work function, differing from the first work function; and
- the third work function differs from the second work function.

2. The process of claim 1 wherein, in response to the siliciding step, the siliciding increases dopant concentration in the first metal layer relative to dopant concentration in the precursor layer.

3. The process of claim 1 wherein the first dopant comprises n-dopants and wherein the second dopant comprises p-dopants.

4. The process of claim 3 further comprising etching the precursor layer and first metal layer thereby to produce gate stacks after the doping steps and before driving the dopants.

5. The process of claim 1 further comprising etching to define a stack including a portion of the precursor layer atop the stack, the etching being prior to the siliciding.

6. The process of claim 1 further comprising:
depositing metallic material atop the doped precursor;
etching to define a stack including said metallic material atop the stack, the etching being prior to the siliciding.

7. The process of claim 1 further comprising subsequently etching after the siliciding, the etching thereby defining a gate stack including silicide on the first metal layer.

8. The process of claim 1 wherein the semiconductor region comprises an initially unactivated doped substrate beneath the gate dielectric, the substrate having channel and source/drain areas, wherein the siliciding is performed at a temperature that simultaneously activates dopants added to the source/drain areas in the substrate.

9. The process of claim 1 for use with a substrate having a channel, the process further comprising non-uniformly doping the channel.

10. The process of claim 1 for use with a substrate having a channel, for making integrated circuits having long-channel transistors and short-channel transistors, the process further comprising using a pocket dose implant that is established in the channel beneath and around the gate to create non-uniform doping in the channel for short channel transistor, and Vt adjust implant for substantially uniform channel doping concentration across the gate length for long channel transistor.

11. The process of claim 1 for making integrated circuits that have a substrate beneath the gate dielectric, the process further comprising establishing an initial doped well in the substrate prior to the driving step, and forming source/drains thereby defining a channel therebetween, the channel retaining the doping characteristics of the initial doped well throughout the process substantially unchanged.

12. The process of claim 1 wherein the first metal layer is selected from the group consisting of metal nitride, metal carbide, and metal boride.

13. The process of claim 12 wherein the first metal layer is selected from the group consisting of titanium nitride and tantalum nitride.

14. The process of claim 1 wherein said siliciding utilizes precursor with a metallic material selected from the group consisting of nickel (Ni), cobalt (Co), platinum (Pt), tantalum (Ta), and any alloy of at least two of the foregoing.

15. The process of claim 1 wherein the first metal layer is selected from the group consisting of metal nitride, metal carbide, or metal boride and said consuming utilizes precursor consumed with a metallic material selected from the group consisting of nickel (Ni), cobalt (Co), platinum (Pt), tantalum (Ta), and any alloy of at least two of the foregoing.

16. The process of claim 1 wherein the consumed precursor is substantially composed of a nickel silicide, and the barrier material is substantially composed of titanium nitride.

17. The process of claim 1 wherein further in response to the siliciding step the third work function is driven in an opposite directions relative to the second work function.

* * * * *